United States Patent
Kawasaki et al.

[11] Patent Number: 6,057,561
[45] Date of Patent: May 2, 2000

[54] OPTICAL SEMICONDUCTOR ELEMENT

[75] Inventors: Masashi Kawasaki, Yokohama; Hideomi Koinuma, Tokyo; Akira Ohtomo, Yamato; Yusaburo Segawa, Tokyo; Takashi Yasuda, Sendai, all of Japan

[73] Assignee: Japan Science and Technology Corporation, Japan

[21] Appl. No.: 09/032,025

[22] Filed: Feb. 27, 1998

[30] Foreign Application Priority Data

| Mar. 7, 1997 | [JP] | Japan | .................................... 9-068978 |
| Mar. 25, 1997 | [JP] | Japan | .................................... 9-072003 |

[51] Int. Cl.⁷ .................................................. H01L 33/00
[52] U.S. Cl. ................ 257/94; 257/96; 257/97; 257/98; 257/103; 438/22; 438/34; 372/45; 372/46
[58] Field of Search ................ 257/94, 96, 97, 257/103, 98; 438/34, 22; 372/45, 46

[56] References Cited

U.S. PATENT DOCUMENTS

| 4,081,764 | 3/1978 | Christmann et al. .............. 331/94.5 H |
| 4,181,627 | 1/1980 | Weiher et al. ................... 252/301.6 R |
| 4,907,043 | 3/1990 | Uekita et al. .............................. 357/17 |
| 5,289,081 | 2/1994 | Tamatani et al. ........................ 313/487 |
| 5,317,583 | 5/1994 | Nasibov et al. ........................... 372/43 |
| 5,319,282 | 6/1994 | Winsor ................................. 315/169.4 |
| 5,334,855 | 8/1994 | Moyer et al. ............................. 257/13 |
| 5,446,286 | 8/1995 | Bhargava ........................... 250/361 R |
| 5,537,000 | 7/1996 | Alivisatos et al. ...................... 313/506 |
| 5,821,685 | 10/1998 | Petersen ................................. 313/467 |

*Primary Examiner*—William Mintel
*Attorney, Agent, or Firm*—Lorusso & Loud

[57] ABSTRACT

A ZnO thin film is fabricated on the c-surface of a sapphire substrate through use of a laser molecular beam epitaxy (MBE) method-which is effective for epitaxial growth of an oxide thin film through control at an atomic level. The thus-formed ZnO thin film has a considerably high crystallinity; the half width of an X-ray rocking curve was 0.06°. The thin film is of an n-type and has a carrier density of $4 \times 10^{17}/cm^3$. The thin film fabricated in a state in which oxygen partial pressure is held constant at $10^{-6}$ Torr has a structure in which hexagon-shaped nanocrystals of uniform size are close-packed, reflecting the crystal behavior of a wurtzite type. Since in each nanocrystal there is observed a spiral structure formed by steps of a unit cell height (0.5 nm), the nanocrystals are considered to grow in a thermodynamically equilibrated state. The lateral size of the nanocrystal can be controlled within the range of approximately 50 to 250 nm. A II-oxide optical semiconductor element utilizes a zinc oxide thin film containing magnesium or cadmium in a solid-solution state. Through addition of magnesium or cadmium, the band gap of zinc oxide can be controlled within the range of 3 to 4 eV.

22 Claims, 32 Drawing Sheets

F I G. 2
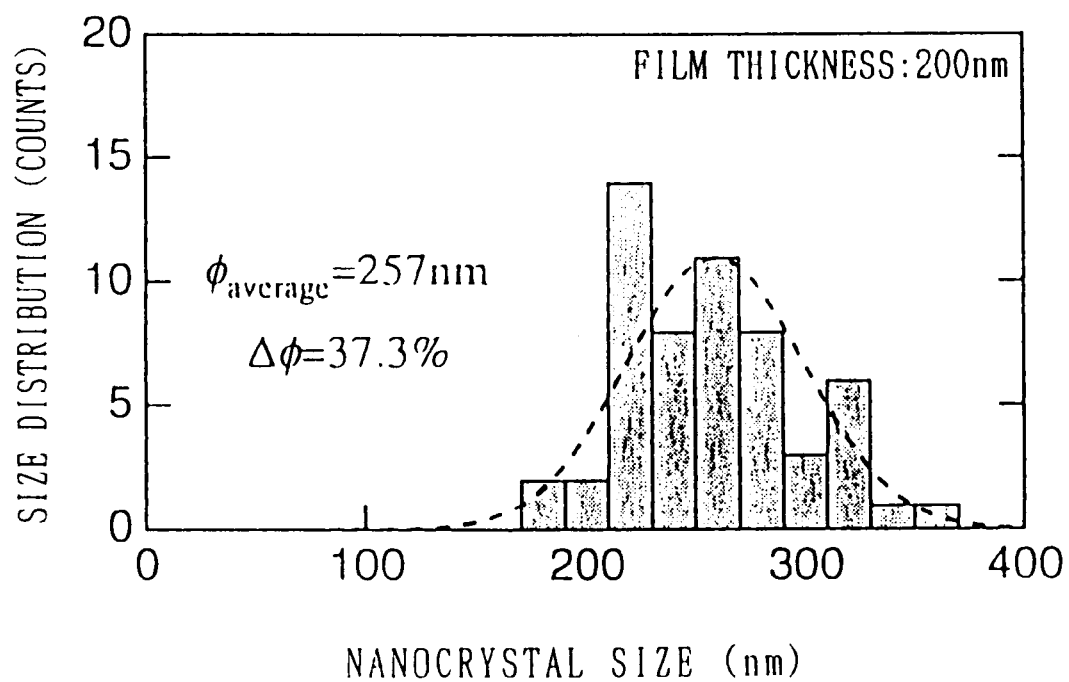

F I G. 3
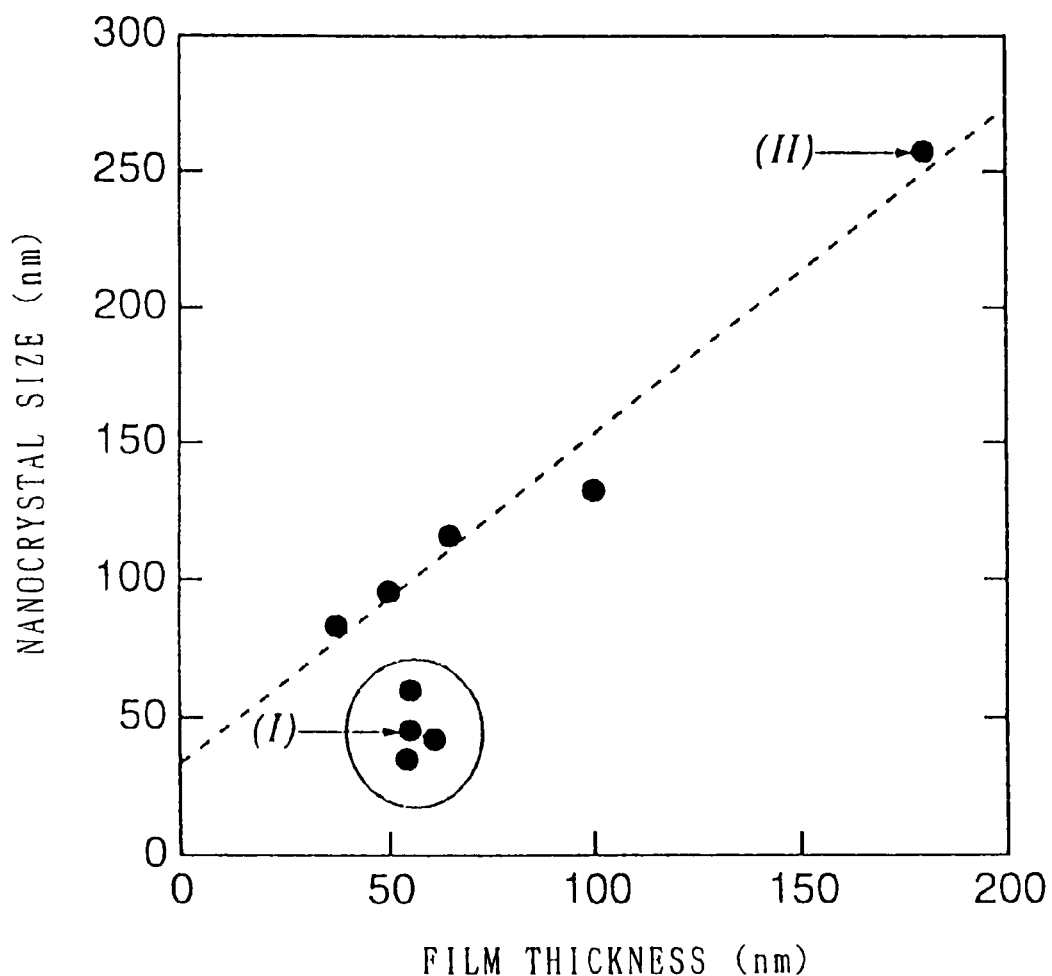

F I G. 5
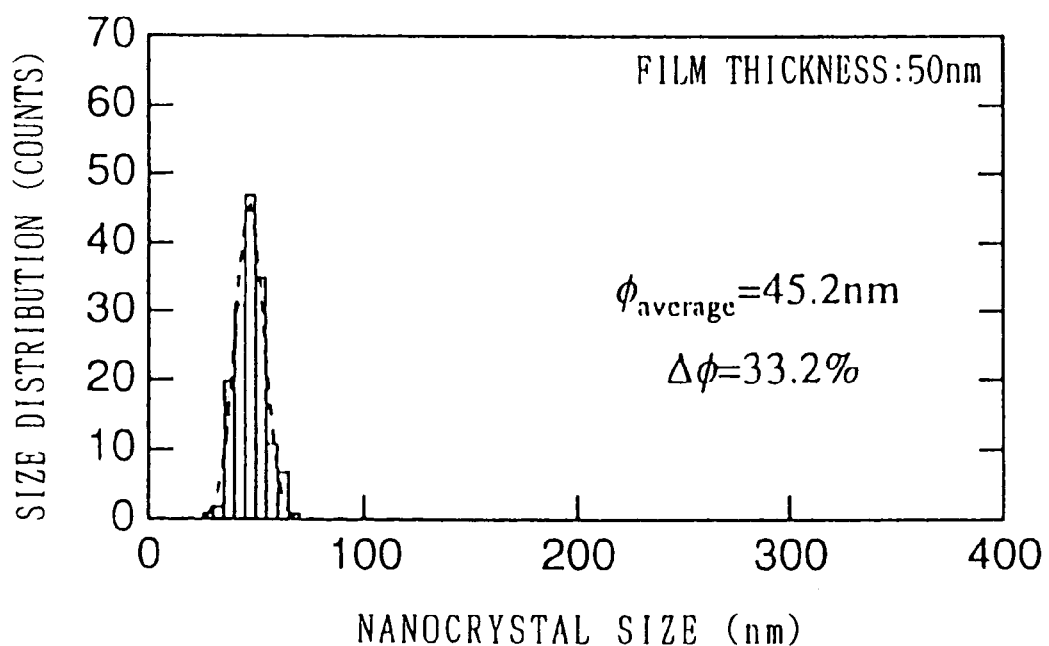

FIG. 8 (A) NUCLEUS GENERATION
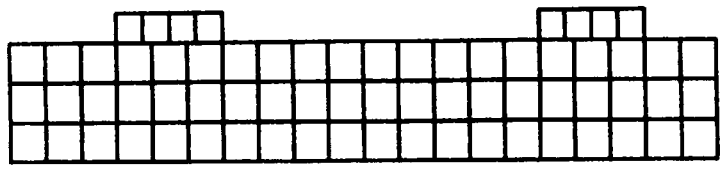
FIG. 8 (B) GROWTH ALONG SURFACE
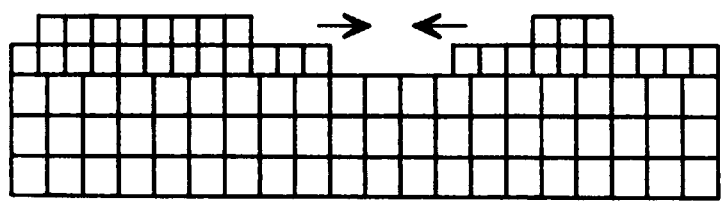
FIG. 8 (C) GENERATION OF INCOHERENT GRAIN BOUNDARIES
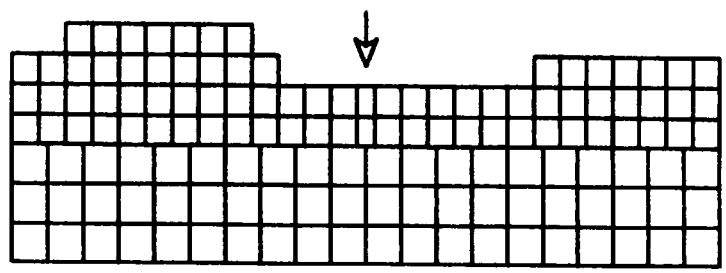

F I G. 13
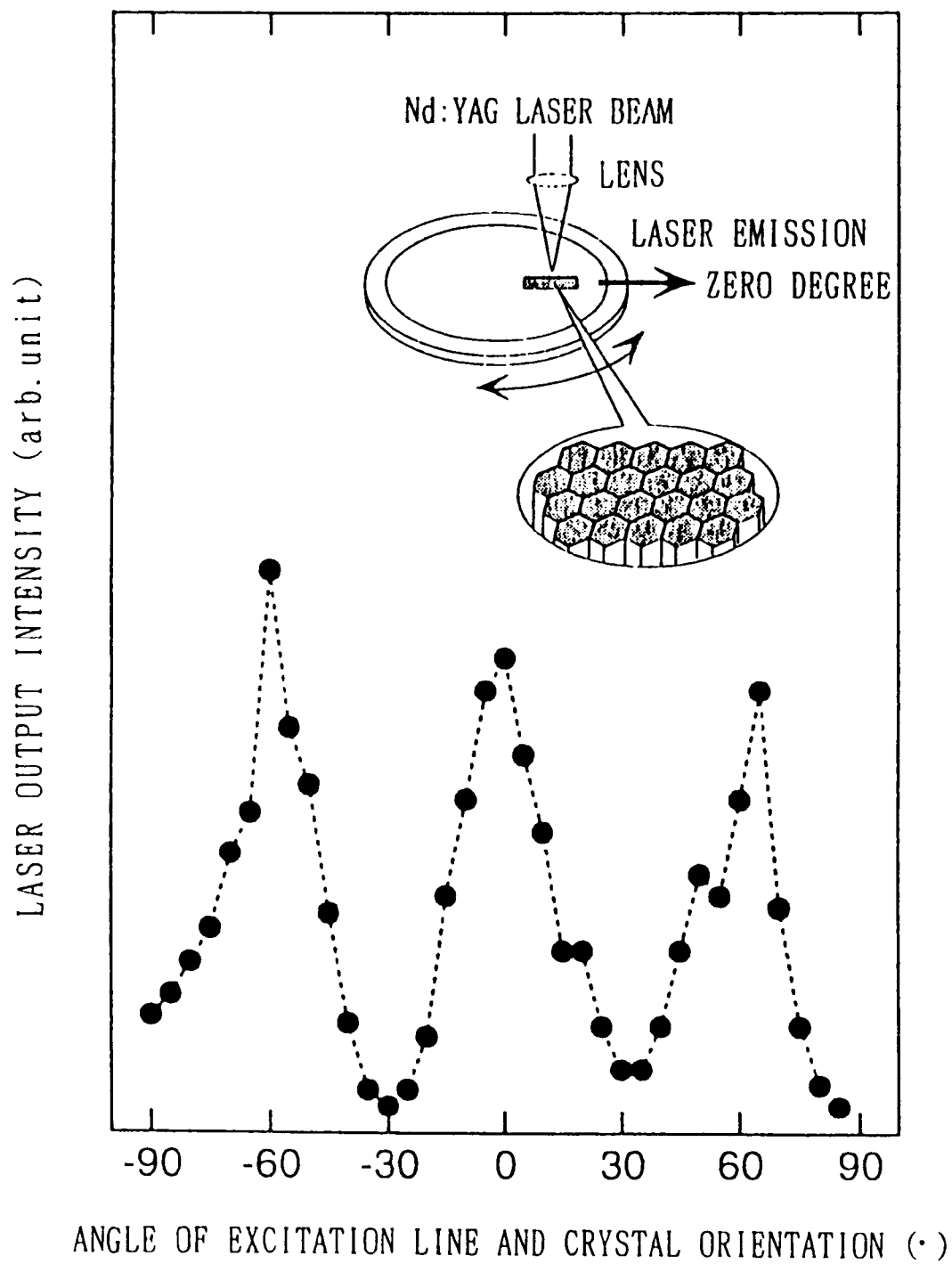

F I G. 15
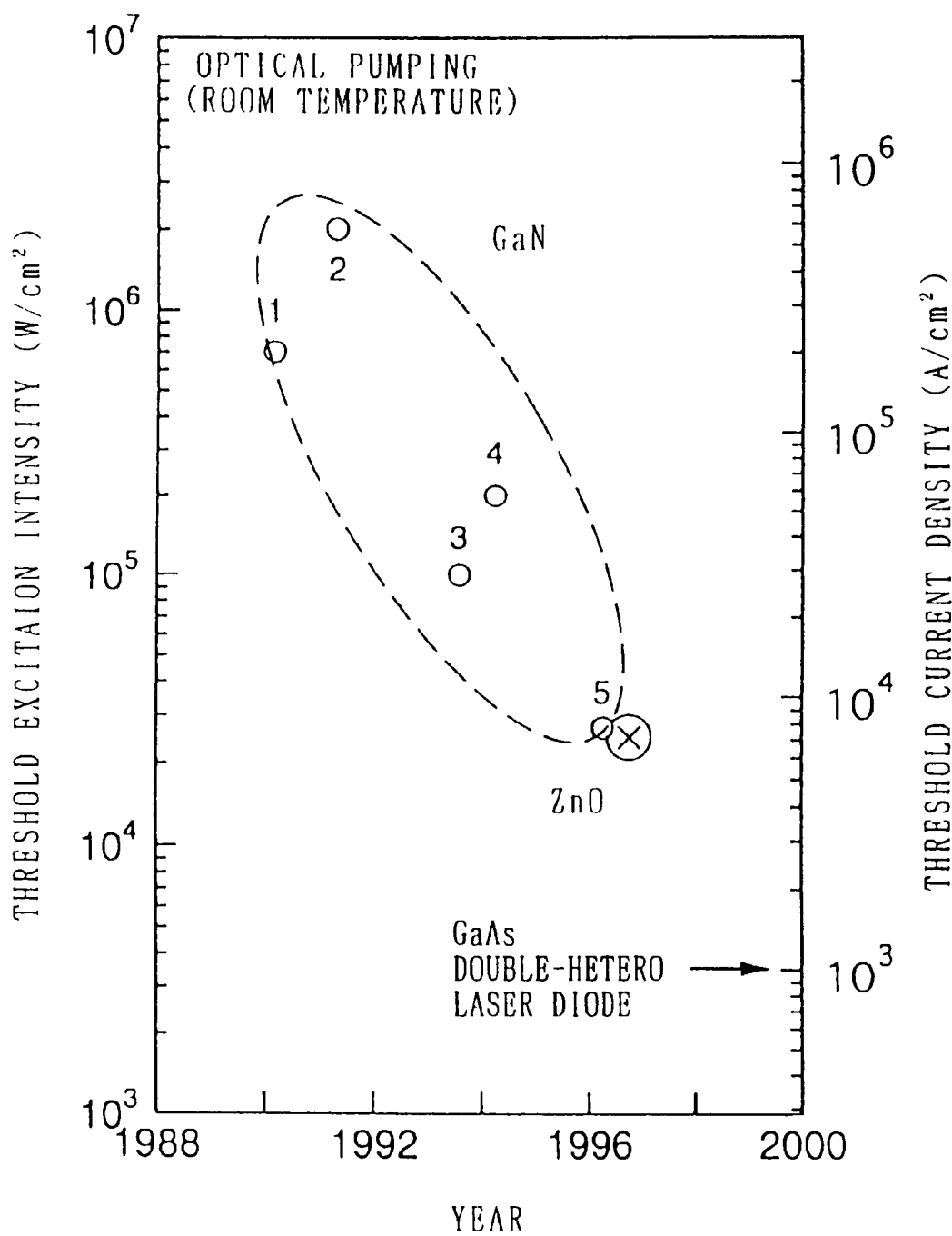

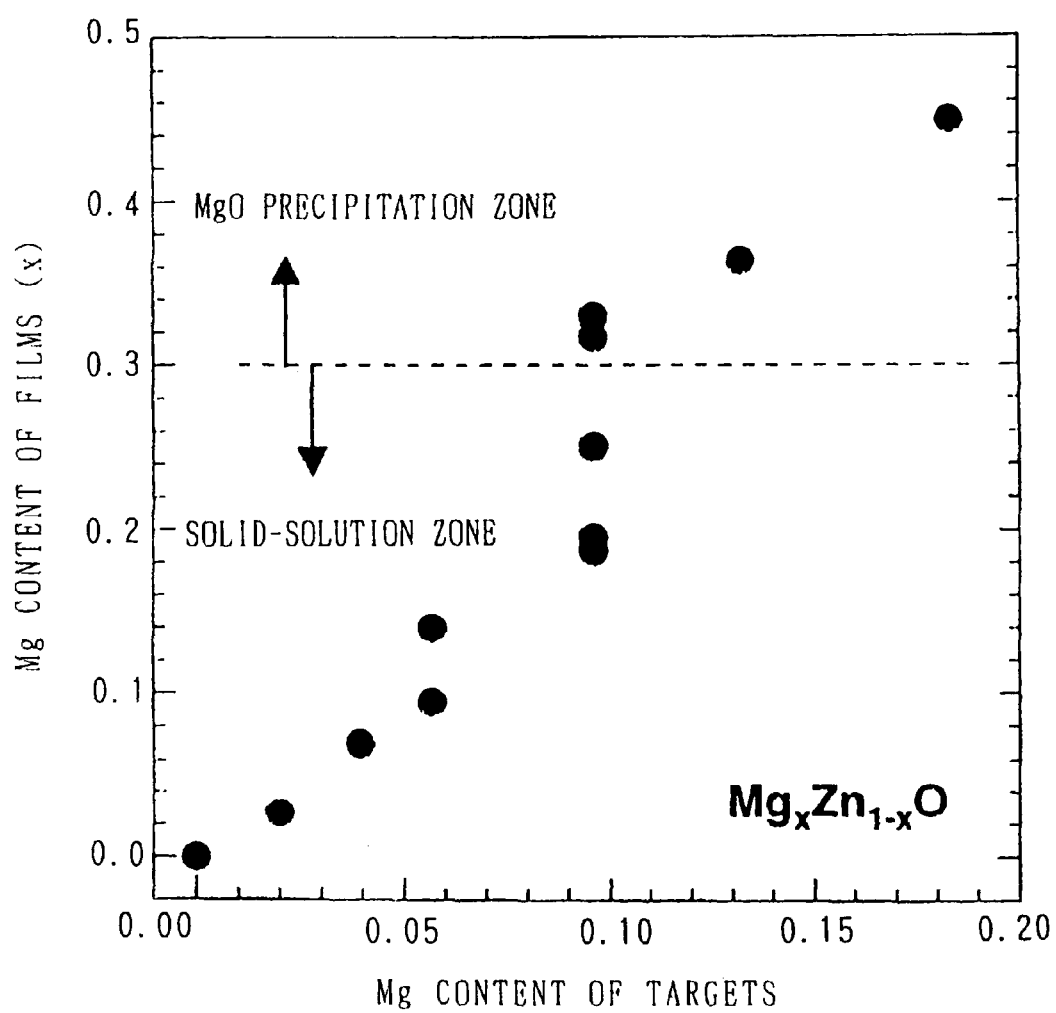
F I G. 16

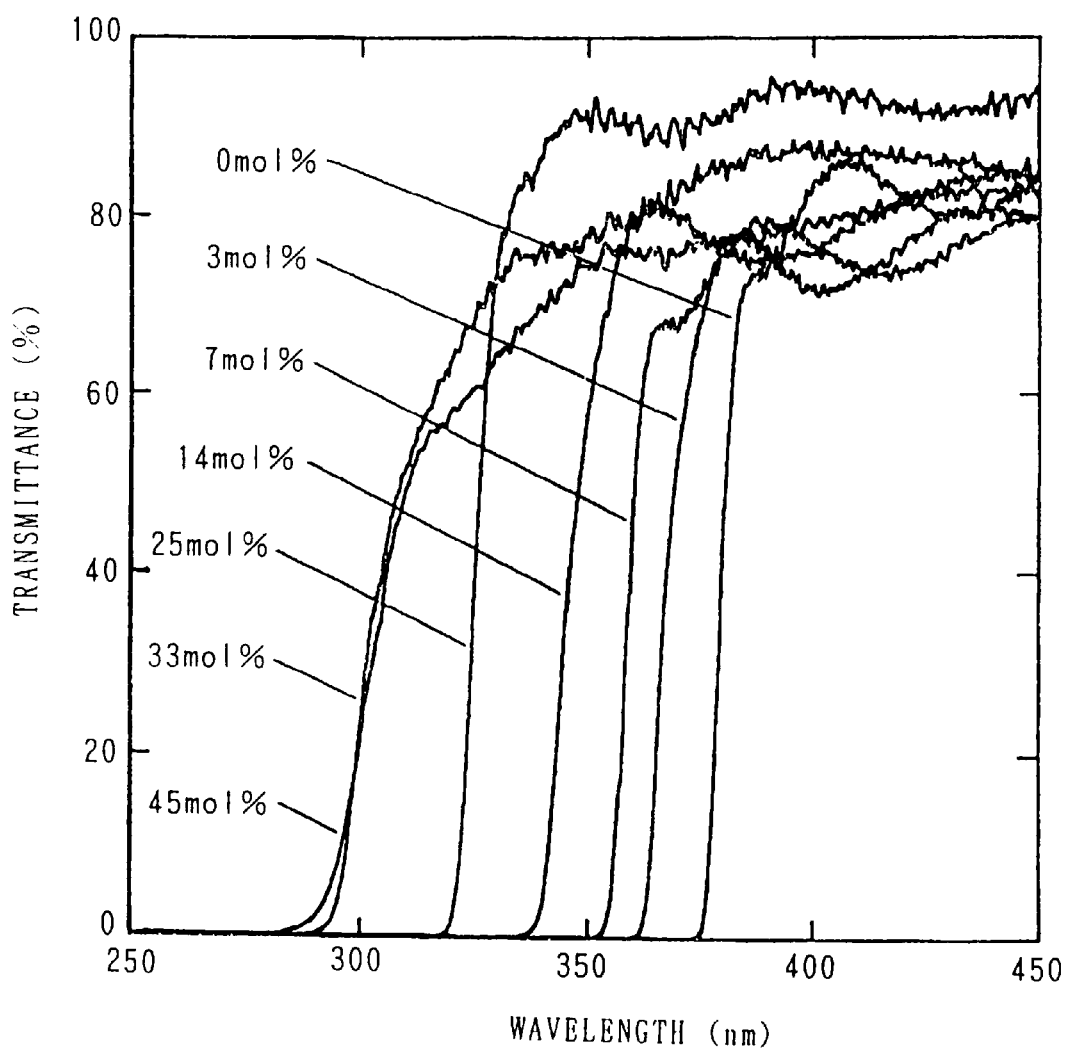
F I G. 18

F I G. 19
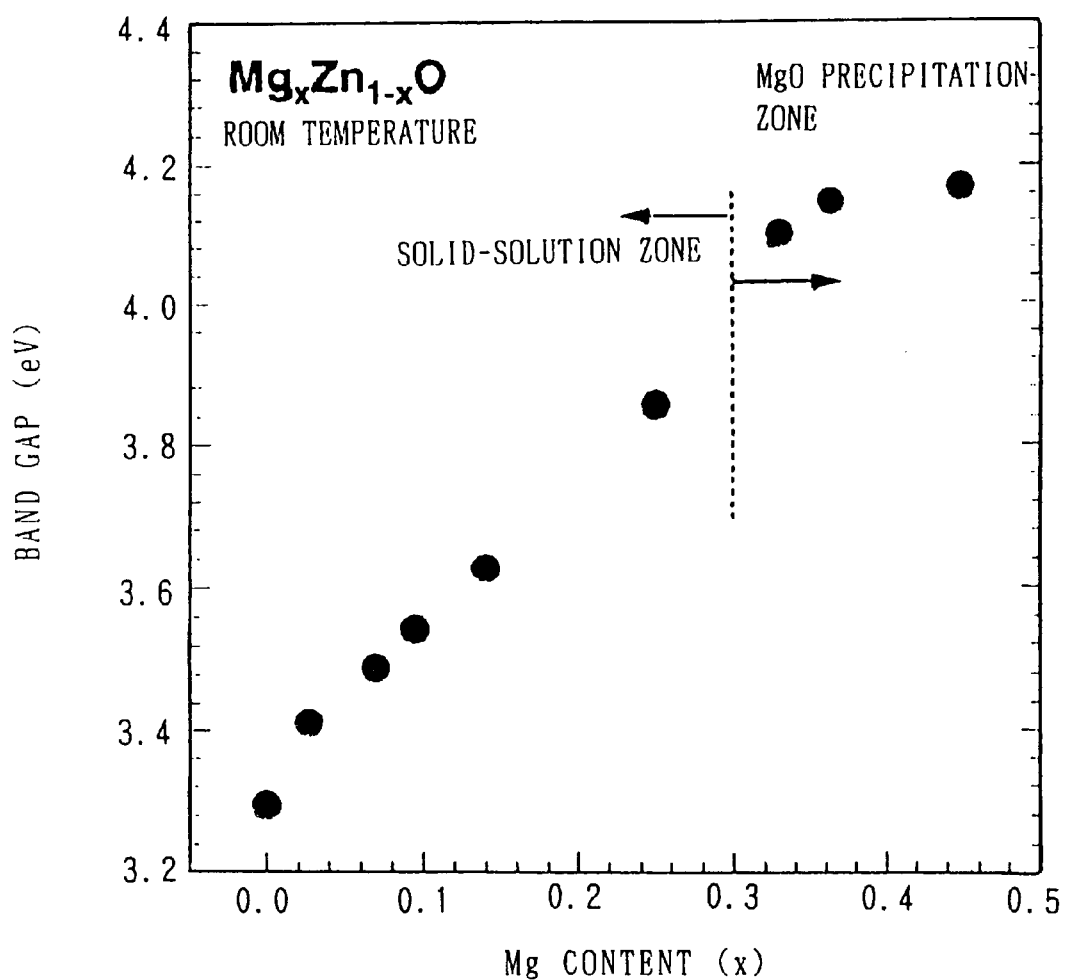

F I G. 21
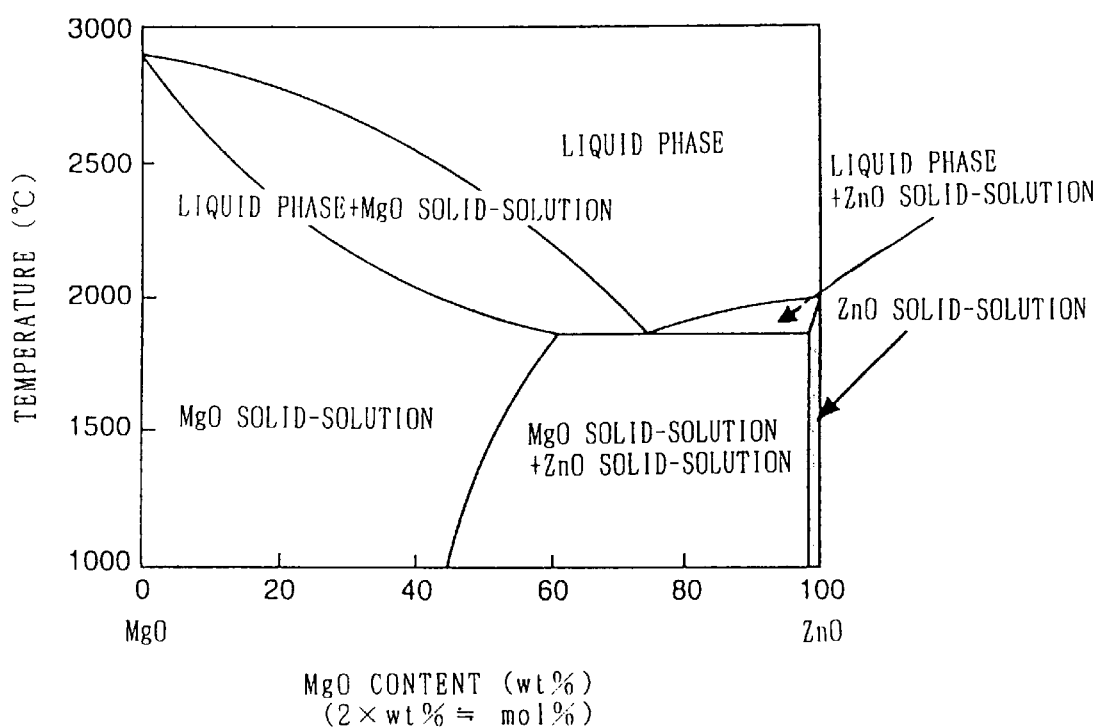

F I G. 22
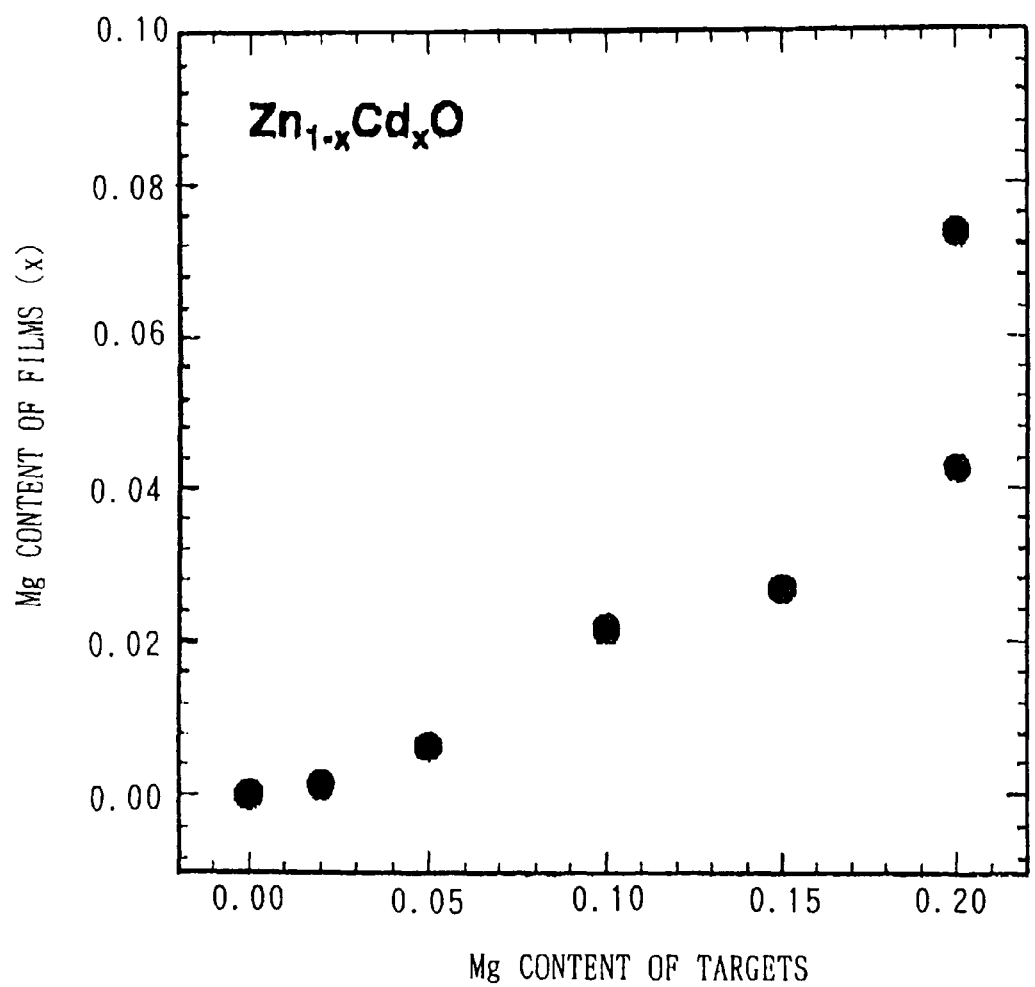

F I G. 26
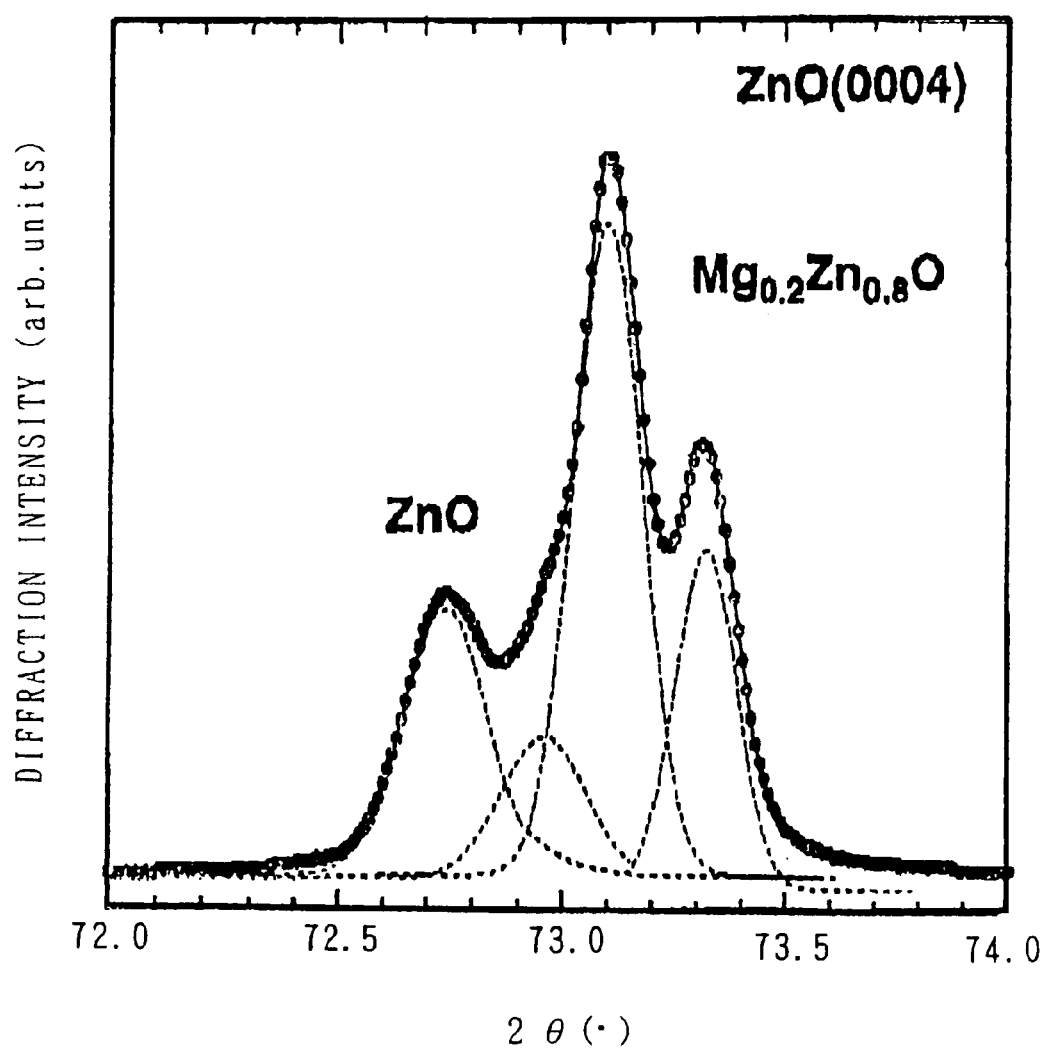

F I G. 29
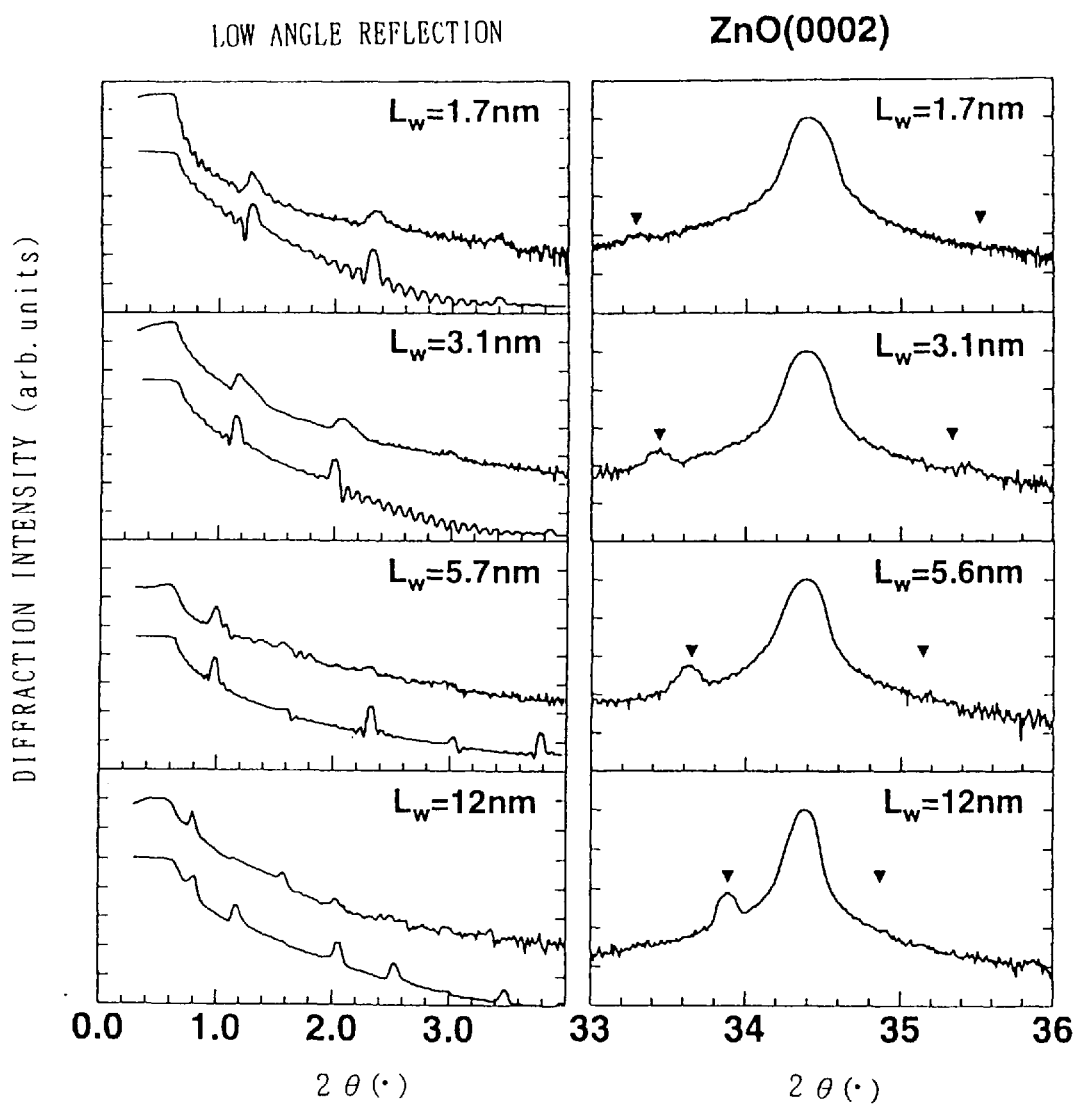

OPTICAL SEMICONDUCTOR ELEMENT

BACKGROUND OF THE INVENTION

1. Field of the Invention

The present invention relates to optical semiconductor elements such as a light emitting element, a laser element, and a color display element, as well as to a fabricating method therefor.

2. Description of the Related Art

In manufacture of light emitting elements in the blue and ultra-violet ranges, only III-nitride compound semiconductor and II-selenide/sulphide compound semiconductor have been used or are expected to be used.

Light emitting elements manufactured through use of these compound semiconductors materials have the following features.

(1) (Al—Ga—In)N alloy crystals classified as III-nitride compound semiconductors:
 (a) These materials emit light in spite of their considerably high defect density. The wavelength of the emitted light is in the range of 390 to 430 nm.
 (b) A 450 nm blue-light emitting diode is already in practical use.
 (c) Continuous laser oscillation of a 408 nm blue-light laser diode at room temperature has been reported.

(2) (Zn—Cd—Mg)(Se—S) alloy crystals classified as II-selenide/sulphide compound semiconductors:
 (a) These materials have excellent lattice matching with a GaAs substrate, and can be grown at low temperature.
 (b) These materials emit light having a wavelength of 430 to 500 nm.

However, the III-nltride and II-selenide/sulphide compound semiconductors have a drawback in that mixture of oxygen causes a serious problem.

Further, the III-nitride and II-selenide/sulphide compound semiconductors have the following individual problems.

(1) (Al—Ga—In)N alloy crystals classified as III-nitride compound semiconductors:
 (a) Manufacture of these materials requires a high temperature (~1200° C.).
 (b) Since the cleavage characteristic differs from that of a sapphire substrate, formation of an end surface of a resonator is difficult.
 (c) There exists no substrate whose lattice matches that of this material.
 (d) Since the active layer is formed of In-doped GaN, the wavelength of emitted light is large.
 (e) The threshold for laser oscillation is high.
 (f) Formation of p-type thin film having a low resistance is difficult.
 (g) Since the high resistance of the p-type layer causes concentration of supplied voltage to an interface between the p-type layer and an electrode, the operating voltage is considerably high.

(2) (Zn—Cd—Mg)(Se—S) alloy crystals classified as II-selenide/sulphide compound semiconductors:
 (a) The lifetime of a laser diode made of these materials is very short.
 (b) Practical use of these materials is considered difficult, in view of very slow progress during an extremely long research period (study started in 1980).

SUMMARY OF THE INVENTION

A first object of the present invention is to provide an optical semiconductor element which operates on the basis of UV light laser emission of zinc oxide (ZnO) at room temperature.

A second object of the present invention is to provide an optical semiconductor element formed of II-oxide alloy crystals whose emission of light is effected by recombination of excitons at room temperature.

A third object of the present invention is to provide a method-of fabricating the optical semiconductor element through use of a thin film technique.

To achieve the above objects, according to a first aspect of the present invention, there is provided an optical semiconductor element in which a thin film containing ZnO is used as a light emitting layer.

Preferably, grain boundaries existing in the thin film are utilized as resonators to thereby enable laser oscillation by exciton at room temperature.

Preferably, the thin film is a thin film composed of hexagonal ZnO nanocrystals formed by use of a laser molecular beam epitaxy (MBE) method.

Preferably, the optical semiconductor element further comprises a fluorescence layer that is excited by ultraviolet or blue light emitted from the light emitting layer to generate light, thereby enabling color display and illumination.

According to a second aspect of the present invention, there is provided a method of fabricating an optical semiconductor element in which a ZnO-containing thin film that serves as a light emitting layer is formed on a substrate of a sapphire c-surface through laser molecular beam epitaxy.

In the method, the formation of the ZnO-containing thin film on the sapphire substrate is preferably carried out by two separate steps of forming nuclei which determine size and density of nanocrystals, and growing the nuclei.

According to a third aspect of the present invention, there is provided a II-oxide optical semiconductor element which comprises a zinc oxide thin film containing magnesium in a solid solution state or mixed phase state.

Preferably, the II-oxide optical semiconductor element utilizes modulation of the band of the zinc oxide thin film resulting from the presence of the magnesium in a solid solution state or mixed phase state.

According to a fourth aspect of the present invention, there is provided a II-oxide optical semiconductor element which comprises a zinc oxide film containing cadmium in a solid solution state or mixed phase state.

Preferably, the II-oxide optical semiconductor element utilizes modulation of the band of the zinc oxide thin film resulting from the presence of the cadmium in a solid solution state or mixed phase state.

The II-oxide optical semiconductor element further comprises a fluorescence layer that is excited by ultraviolet or blue light emitted from the light emitting layer to generate light, thereby enabling color display and illumination.

The II-oxide optical semiconductor element preferably has a double heterostructure in which the zinc oxide thin film serving as a light emitting layer is sandwiched between zinc oxide thin films each containing magnesium in a solid solution state and serving as a carrier confinement and clad layer.

According to a fifth aspect of the present invention, there is provided a method of fabricating a II-oxide optical semiconductor element in which a zinc oxide thin film containing magnesium in a solid solution state is formed on a substrate through laser molecular beam epitaxy.

According to a sixth aspect of the present invention, there is provided a method of fabricating a II-oxide optical semiconductor element in which a zinc oxide thin film containing cadmium in a solid solution state is formed on a substrate through laser molecular beam epitaxy.

According to a seventh aspect of the present invention, there is provided an optical semiconductor element in which a thin film of $AlCuO_2$ is used as an intermediate layer disposed between a p-type zinc oxide layer and an electrode.

BRIEF DESCRIPTION OF THE DRAWINGS

FIG. 2 is a diagram showing a distribution of size of nanocrystals in the 200 nm-thick ZnO thin film;

FIG. 3 is a plot showing the relationship between the film thickness and the size of nanocrystals;

FIG. 5 is a diagram showing a distribution of size of nanocrystals in the 50 nm-thick ZnO thin film;

FIG. 8 is an explanatory diagram showing the generation of incoherent grain boundaries;

FIG. 13 is a plot showing the angular dependence of P∞ laser emission intensity;

FIG. 15 is an illustration showing a historical change in the laser oscillation threshold in GaN and ZnO;

FIG. 16 is a plot showing the relationship between the magnesium content in the targets and the magnesium content in the films in another embodiment of the present invention;

FIG. 18 is a diagram showing the transmission spectrum of a $Zn_{1-x}Mg_xO$ thin film at room temperature:

FIG. 19 is a plot showing variation in the optical band gap of the zinc oxide thin film at room temperature with the magnesium content;

FIG. 21 is a phase diagram of a MgO-ZnO system;

FIG. 22 is a plot showing the relationship between the cadmium content in targets and the cadmium content in the thin films in still another embodiment of the present invention;

FIG. 26 is a plot showing an X-ray diffraction pattern of a layered film composed of zinc oxide thin film containing magnesium in a solid solution state and zinc oxide film;

FIG. 29 is a diagram showing an X-ray diffraction pattern of the superlattice thin films with different ZnO well layer thickness;

DESCRIPTION OF THE PREFERRED EMBODIMENTS

Figure 1:
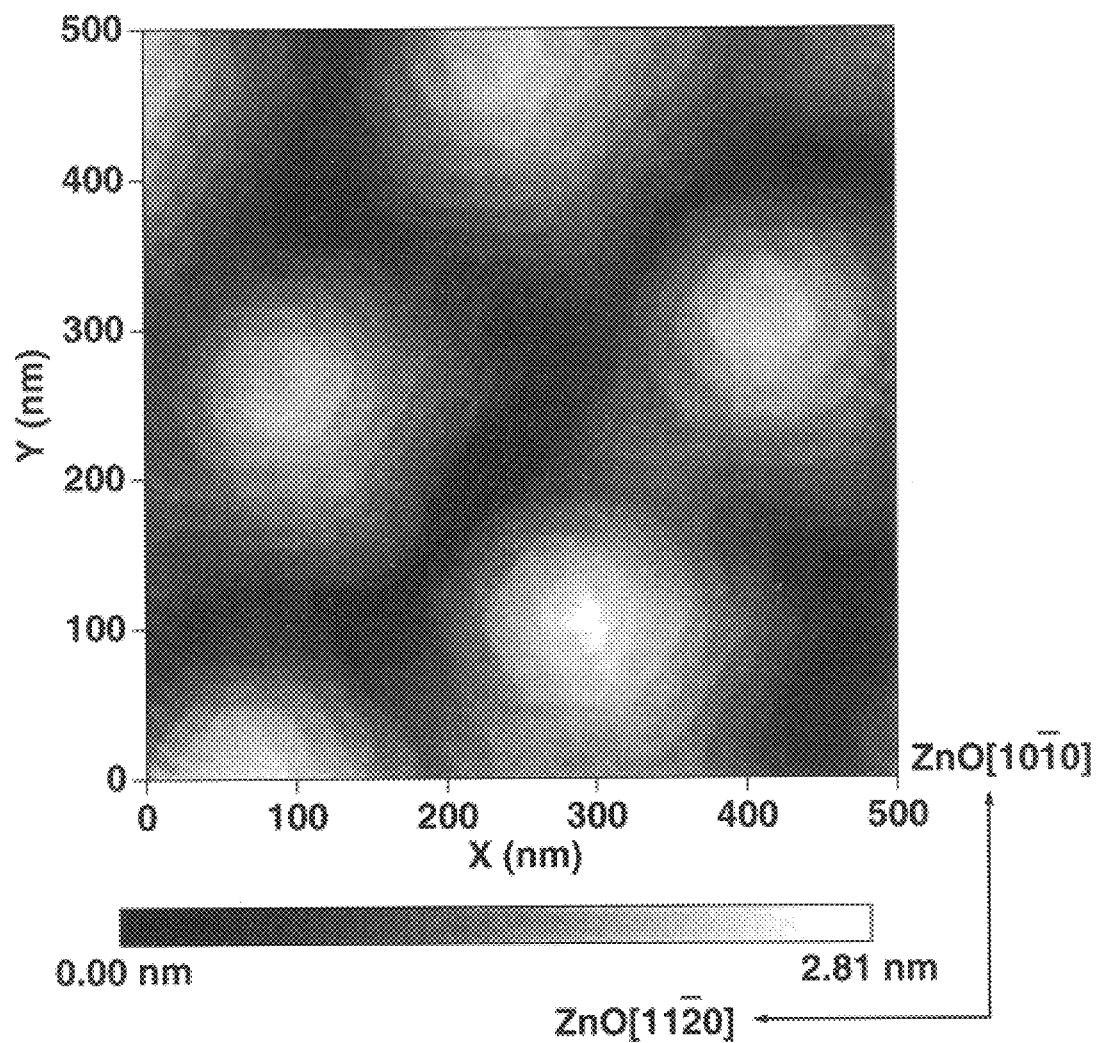
FIG. 1 is an AFM (atomic force microscopy) image of a ZnO nanocrystal thin film having a thickness of 200 nm according to an embodiment of the present invention.

Embodiments of the present invention will next be described in detail with reference to the drawings.

A typical example of an optically functioning oxide material is an "optical crystal" such as a solid laser crystal and a photorefractive crystal. Most of these optically functioning oxide materials are insulating materials having a band gap of 4 eV or greater and a function to control light in accordance with electricity, light, magnetism, or sound through utilization of their ferroelectric or piezoelectric properties.

The present invention is directed to an optically functioning material that attains an optical function as a semiconductor; i.e., generation of photons caused by coupling or combination of carriers.

The present invention provides an optical semiconductor element that exhibits UV laser emission of ZnO at room temperature.

ZnO is a wide bandgap II–VI semiconductor material having an absorption edge in the ultraviolet range ($E_g$=3.37 eV at room temperature). The physical parameters of ZnO are shown in Table 1 for comparison with those of III-nitride and II-selenide/sulphide, which have been studied as materials for blue/UV range compound semiconductor lasers in an effort to improve optical recording density.

TABLE 1

| Material | $E_g$ (eV) | $\mu$ | $\epsilon$ | $r_B$ | $E_b^{ex}$ (meV) | a | c | $T_{melt}$ (° C.) |
|---|---|---|---|---|---|---|---|---|
| ZnO (wurtzite) | 3.37 | 0.19 | 8.5 | 18 | 60 | 3.25 | 5.20 | 1970 |
| GaN (wurtzite) | 3.4 | 0.16 | 9.5 | 31 | 24 | 3.19 | 5.19 | 1700 |
| ZnSe (ZB) | 2.7 | 0.14 | 9.1 | 35 | 22 | 5.67 | — | 1520 |

TABLE 1-continued

| Material | $E_g$ (eV) | $\mu$ | $\epsilon$ | $r_B$ | $E_b^{ex}$ (meV) | a | c | $T_{melt}$ (° C.) |
|---|---|---|---|---|---|---|---|---|
| ZnS (ZB) | 3.6 | 0.2 | 8.3 | 22 | 40 | 5.41 | — | 1850 |

$E_g$: band gap at room temperature, $\mu$: effective reduction mass of excitons, $\epsilon$: dielectric constant (⊥c axis), $r_B$: Bohr radius of excitons, a and c: lattice constants, $T_{melt}$: melting temperature The comparison of the above-listed materials reveals that Zno resembles GaN, which is also classified as wurtzite, in terms of band gap and lattice constants. However, it is to be noted that the exciton binding energy ($E_b^{ex}$) of ZnO is very large (60 meV).

The exciton is a unit of elementary excitation excited in a crystal and is composed of an electron and a hole as in a hydrogen atom. Since excitons have the nature of Bose particles, they are expected to yield a highly efficient laser diode. Light emission due to recombination of excitons is dominant at low temperature. However, at room temperature, weakly combined excitons become unable to exist, due to heat energy (25 meV).

Consequently, as in the case of, for example, GaAs/ AlGaAs red semiconductor lasers, the laser emission process is dominated by a state in which dissociated electrons and holes exit at a high density (electron-hole plasma). The considerably large exciton combining force of ZnO is attractive from the viewpoint of study of the physical properties of the exciton system as well as from the viewpoint of device application. Actually, light emission and laser oscillation by excitons of ZnO at low temperature have been studied to a considerable extent, but laser oscillation by excitons at room temperature has not been reported.

Through use of a laser molecular beam epitaxy (MBE) method—which is effective for epitaxial growth of an oxide thin film through control at an atomic level—a ZnO thin film was formed on a substrate that was the c-surface of sapphire. The thus-formed ZnO thin film had a very high crystallinity; the half width of an X-ray rocking curve was 0.06°. The thin film was of an n-type and had a carrier density of $4 \times 10^{17}/cm^3$.

As shown by the AFM image of FIG. 1, the thin film fabricated in a state in which oxygen partial pressure is held constant at $10^{-6}$ Torr has a structure in which hexagon-shaped nanocrystals of uniform size are close-packed, reflecting the crystal behavior of a wurtzite type. Since in each nanocrystal there is observed a spiral structure formed by steps of a unit cell height (0.5 nm), the nanocrystals are considered to grow in a thermodynamically equilibrated state. The lateral size of the nanocrystal can be controlled within the range of approximately 70 to 250 nm. FIG. 1 shows an AFM image (1 $\mu$m×1 $\mu$m) of ZnO nanocrystals of a ZnO thin film having a thickness of 200 nm. The area shown in FIG. 1 has a size of 100 nm×100 nm, and arrows outside the area indicate the orientation of the crystal. The orientation of the crystal accurately coincides with that of a hexagonal shape on the surface of the thin film.

FIG. 2 shows a histogram of size distribution of the nanocrystals. When the thin film has a thickness of 200 nm, average crystal size is 257 nm, and the percent variation of crystal size is 37%. This indicates that the thin film is formed by nanocrystals having a very uniform size. The size distribution of the hexagonal nanocrystals was obtained from the AFM image. The $\Delta\phi$ value obtained through division of size variation by the average size ($\phi_{average}$) was 37.3%. This $\Delta\phi$ value is smaller than typical values reported for other materials (GaAs, GaN, InAs, etc.) manufactured through use of other methods (MBE, MOCVD).

FIG. 3 shows the film-thickness dependency of the size of the nanocrystals. As the thickness increases, the size of the nanocrystals gradually increases from about 70 nm. Such a thin film is formed when a target that has already been used repeatedly is used. At the surface of the ZnO target, ZnO is partially reduced and thus zinc metal is precipitated at the surface. When the ZnO target is a new one, as shown in area (I) in FIG. 3, smaller nanocrystals (50 nm) can be formed. The dots in the area (I) show the respective crystal sizes of a plurality of thin films that were fabricated in a devised manner. Only the films shown in the area (I) exhibit exciton-exciton emission (P∞ emission), which will be described later. The broken line indicates variation in size of nanocrystals with film thickness.

Figure 4:
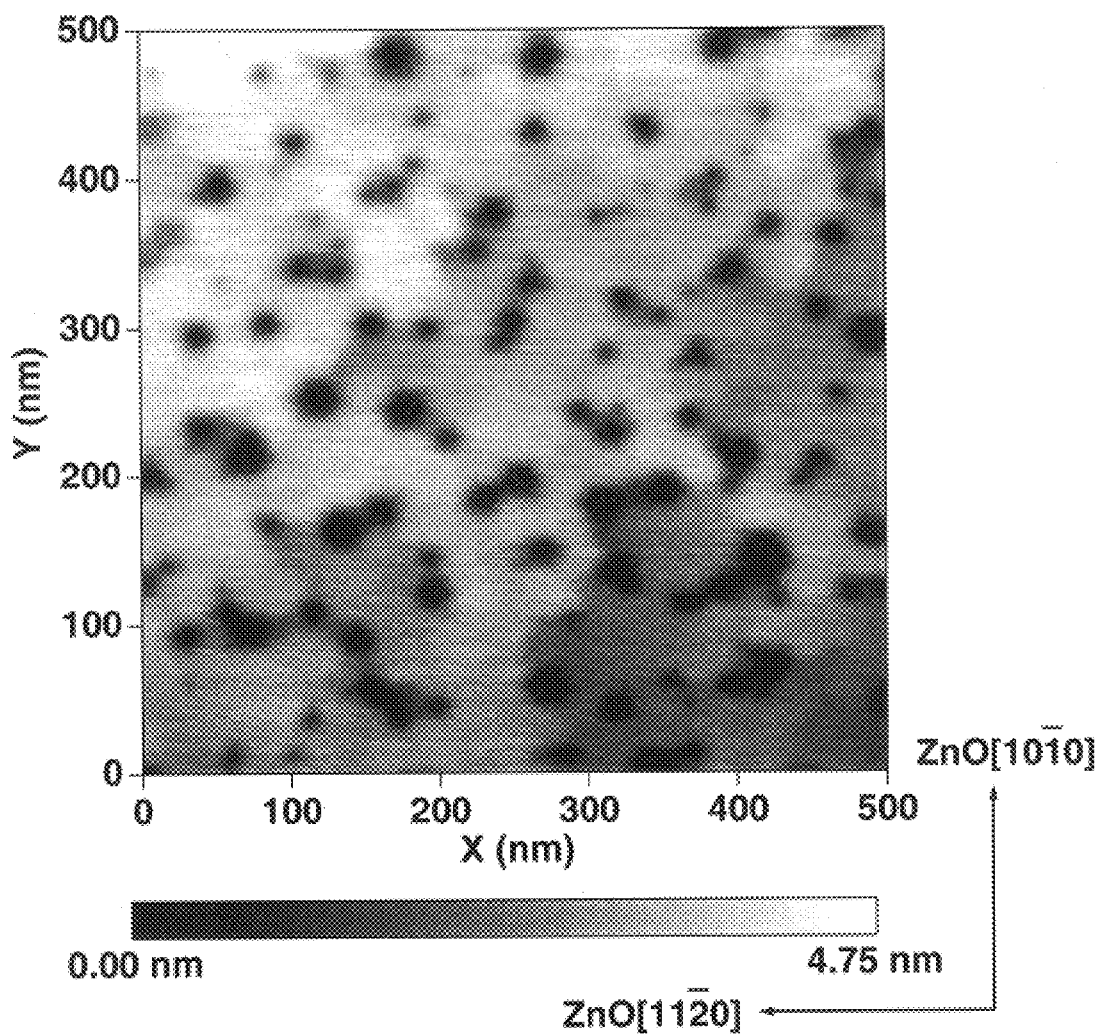
FIG. 4 is an AFM (atomic force microscopy) image of ZnO nanocrystal thin film having a thickness of 50 nm according to the embodiment of the present invention.

FIG. 4 shows an AFM image (1 $\mu$m×1 $\mu$m) of this film, and FIG. 5 shows a histogram of crystal size. FIGS. 4 and 5 correspond to FIGS. 1 and 2. The film shown in FIG. 4 differs from the film shown in FIG. 1 in that the film thickness is 50 nm, the average size is 45 nm, and the value indicating the degree of variation is 33%.

The difference in crystal size is considered to be due to the following reason. When sufficiently oxidized metal zinc atoms are supplied on a substrate, diffusion distance at the surface is short, so that fine crystals are formed. In contrast, when insufficiently oxidized metal zinc atoms are supplied on the substrate, diffusion distance at the surface becomes longer, so that coarse crystals are formed. Further, as the thickness of the thin film is increased, the crystals become fused.

The following methods may be employed to obtain a thin film formed by fine crystals.

(1) A thin film is formed through use of a ZnO target whose surface has been oxidized sufficiently.

(2) Regardless of the surface condition of the target, a thin film is formed in such a way that an oxygen partial pressure is first set to fall within the range of $10^{-5}$ to 1 Torr; a portion of the thin film having a thickness of about 1 nm is formed; nuclei are generated at an arbitrary density; and the remaining portion of the thin film is formed at an oxygen partial pressure of $10^{-6}$ to $10^{-3}$ Torr in order to produce high quality nanocrystals. The fusion speed of the nanocrystals is controlled by the oxygen partial pressure during the second stage.

Figure 6:
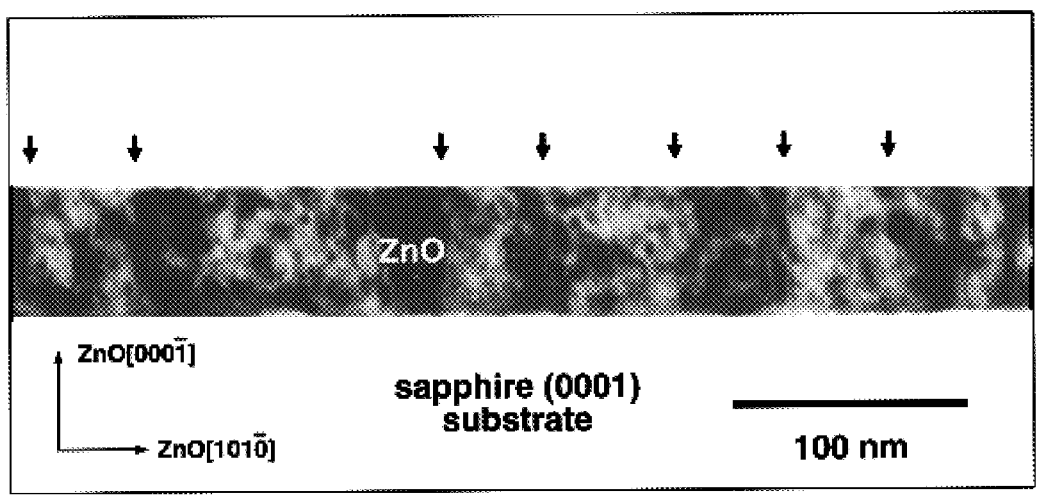
FIG. 6 is a cross-sectional TEM (transmission electron microscopy) image of the 50 nm-thick ZnO thin film.

FIG. 6 shows a cross section (TEM image) of a nanocrystal thin film having a thickness of approximately 50 nm. FIG. 6 shows a cross section taken parallel to a side of the hexagonal shape of the crystal, and the arrows in FIG. 6 show locations where grain boundaries are present. The positions of the grain boundaries correspond to black portions in the AFM image of FIG. 3. FIGS. 4–6 demonstrate that the nanocrystal has a hexagonal-prism-like shape having a thickness of 50 nm and a lateral dimension of 50 nm.

As described above, clear grain boundaries are formed at the boundaries between individual nanocrystals perpendicularly to the substrate surface. A cause of formation of the grain boundaries will be described below.

Figure 7:
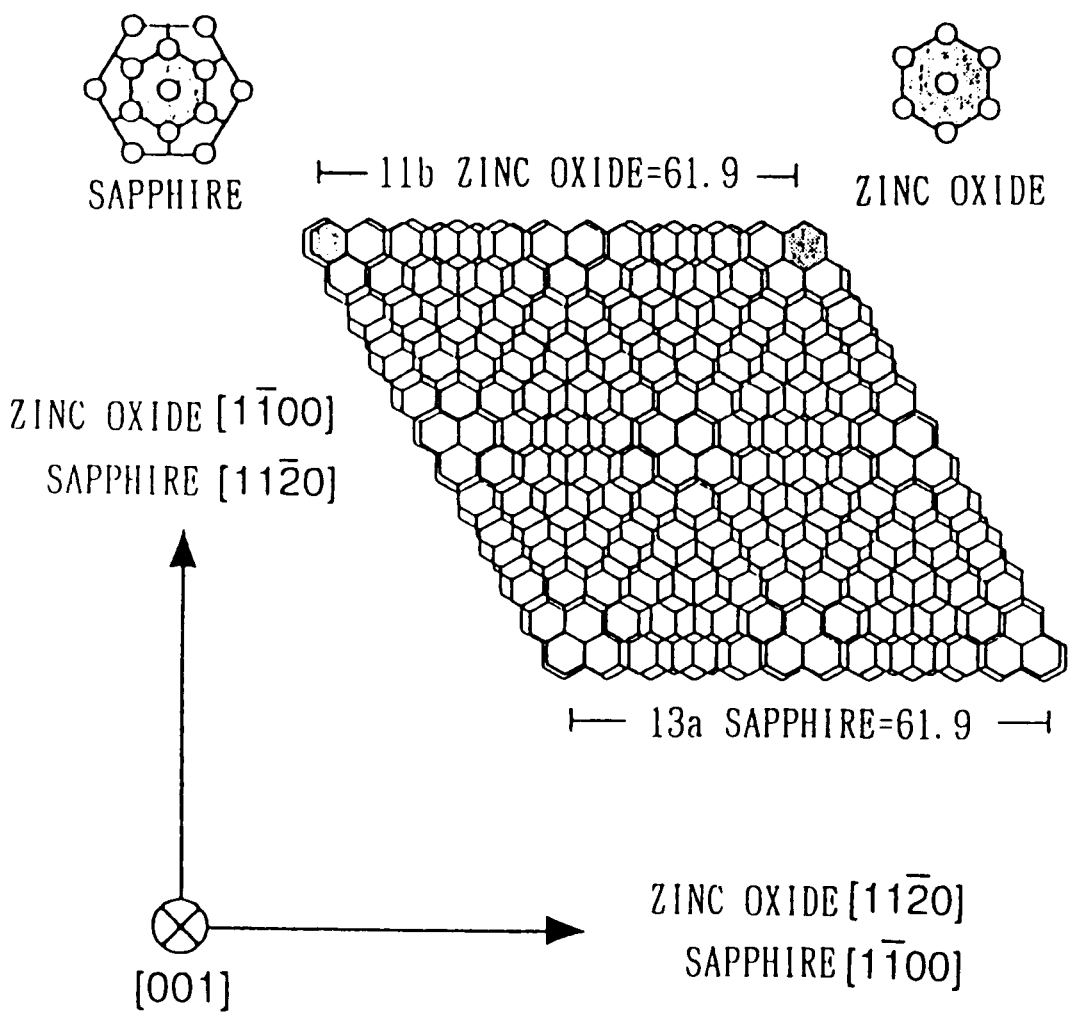
FIG. 7 is a schematic diagram of an interface (higher order epitaxy) between the ZnO thin film and the sapphire substrate in the embodiment of the present invention

As shown in FIG. 7, a lattice mismatch of 18% exists between ZnO and the sapphire c-surface. However, the mismatch between 11 lattices of ZnO and 13 lattices of sapphire and the mismatch between 5 lattices of ZnO and 13 lattices of sapphire are 0.085% and 1.4%, respectively, which are very small compared with the above-described case.

The matching state which has a recurrent distance corresponding to a common multiple of the inter-lattice distance of the substrate and the inter-lattice distance of the thin film is called "higher order epitaxy." Although such higher order epitaxy has been reported in relation to formation of a TiN film on a Si substrate or the like, higher order epitaxy at an oxide-oxide interface has not previously been reported.

FIG. 8 shows the mechanism of generation of grain boundaries in the higher order epitaxy. In order to simplify the explanation, FIG. 8 shows a state in which four lattices of the film crystal match three lattices of the substrate crystal. When nuclei are generated randomly upon satisfaction of conditions of the higher order epitaxy and grown laterally, grains or nuclei come in contact with one another. At this time, a gap whose size corresponds to a fraction of the common multiple is formed, because no correlation exists between the phase of the nuclei and the phase of areas corresponding to the common multiple. In the gap, crystal lattices are deformed or broken, so that grain boundaries are formed there. Although all the crystal grains have the same orientation, their lateral positions differ from one another. Each of the grain boundaries functions as a barrier for exciton confinement and forms a mirror of a laser resonator.

Figure 9:
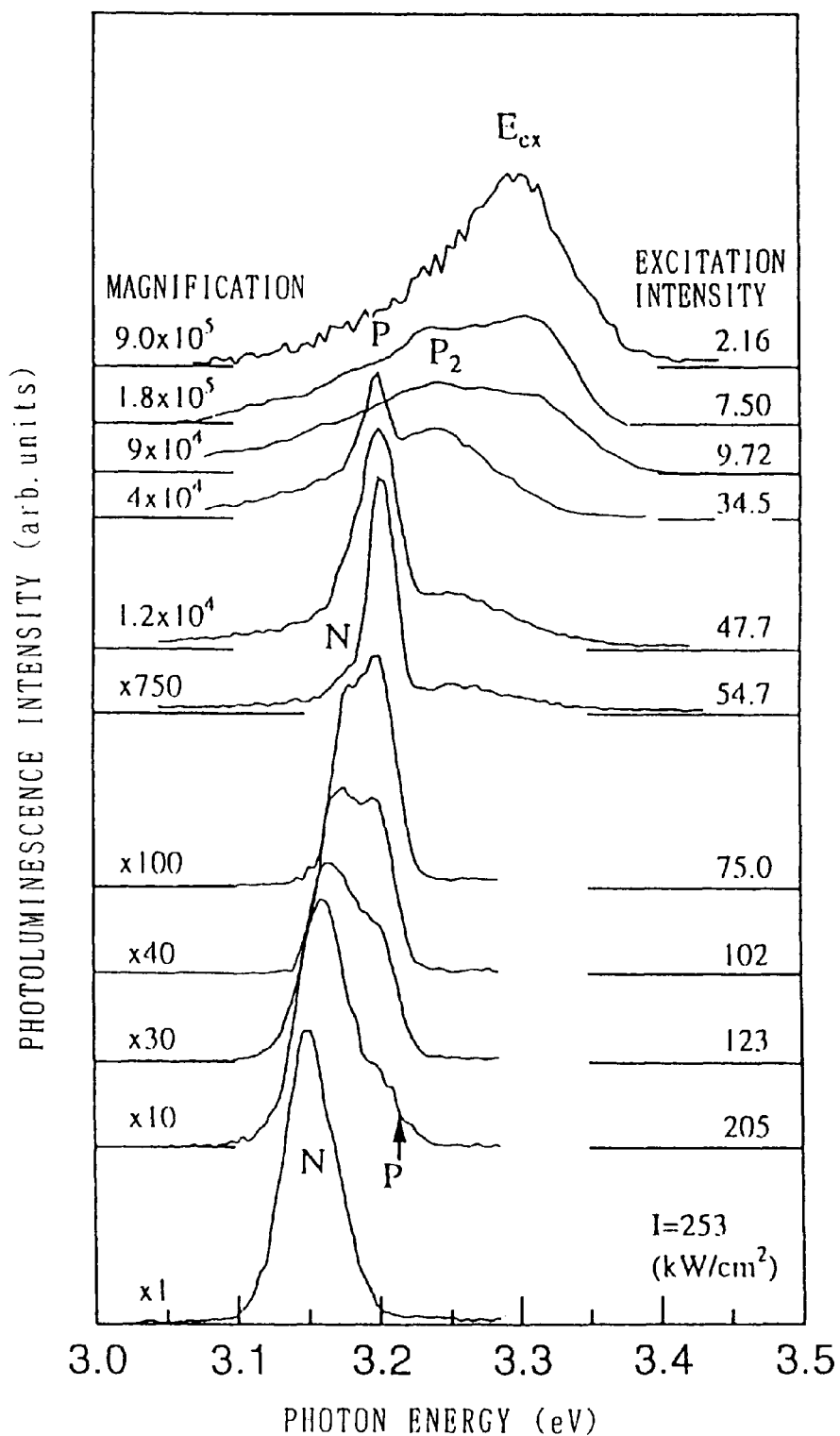
FIG. 9 is a photoluminescence spectrum of the 50 nm-thick ZnO thin film.

The thin film exhibits clear exciton light emission in the UV range at room temperature. FIG. 9 shows a photoluminescence spectrum excited by a Nd:YAG 1/3 wavelength laser (355 nm, 30 psec). The photoluminescence spectrum shows that as the excitation power increases, emission due to free excitons ($E_{ex}$) occurs, and then spontaneous emission resulting from exciton-exciton collision ($p^2$) occurs. When the pumping intensity is increased above a threshold $I_{th}$ (24 kW/cm$^2$), there occurs a strong emission (P∞) whose intensity increases with the eighth power of the pumping intensity, and from 55 kw/cm$^2$, there occurs an emission (N) whose intensity increases with the fifth power of the pumping intensity and which causes saturation.

The emission in the $p^2$ and P∞ bands can be explained as emission due to collision between excitons or recombination of excitons with scattering. One of two excitons in an n=1 state is scattered into an n=2 state ($p^2$ emission) or into an n=∞ state (P∞ emission), while the other exciton emits light through recombination. Since the N emission peak causes a red-shift and broadening as the pumping intensity increases, the N emission is considered to be the above-described electron-hole plasma emission.

Figure 10:
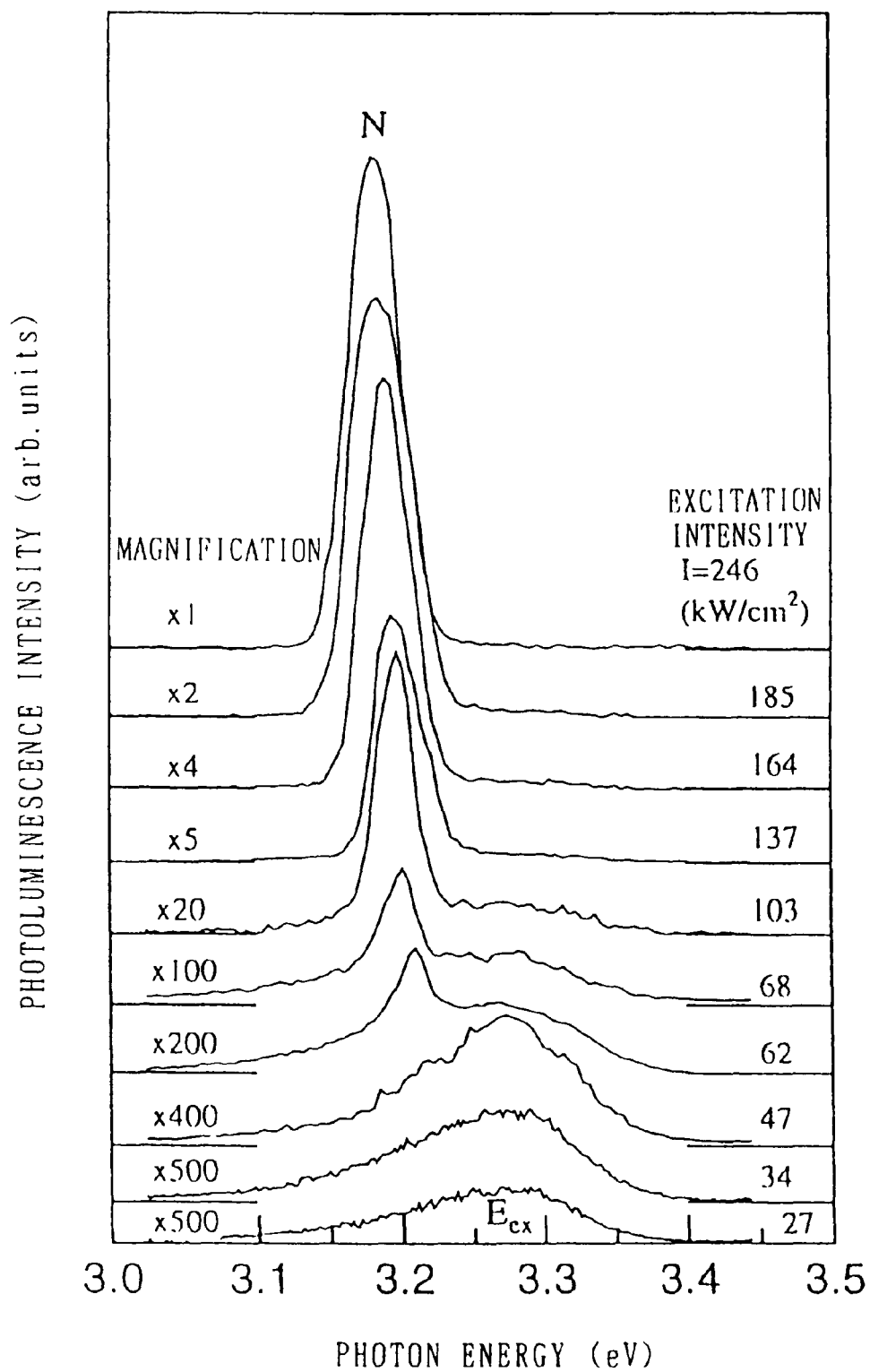
FIG. 10 is a photoluminescence spectrum of the 200 nm-thick ZnO thin film.

FIG. 10 shows a photoluminescence spectrum for the case where the size of nanocrystals is large (approximately 250 nm).

The threshold intensity $I_{th}$ at which laser oscillation occurs is considerably high (62 kW/cm$^2$). $P^2$ emission and P∞ emission are not observed, and N emission occurs first. Efficient P∞ emission is observed only when the size of nanocrystals is controlled to 40 to 60 nm.

From the fact that the threshold for laser oscillation is very low and that P∞ emission is not observed when the size of nanocrystals is large, it is presumed that oscillation intensity is increased due to confinement of carriers (excitons) by the nanocrystals.

P∞ emission can be observed clearly even when a spectrum is measured from the lateral direction of the thin film. At this time, the pumping laser excites the thin film in an area located inside the end surface, and therefore, no artificial resonant mirror exists.

Figure 11:
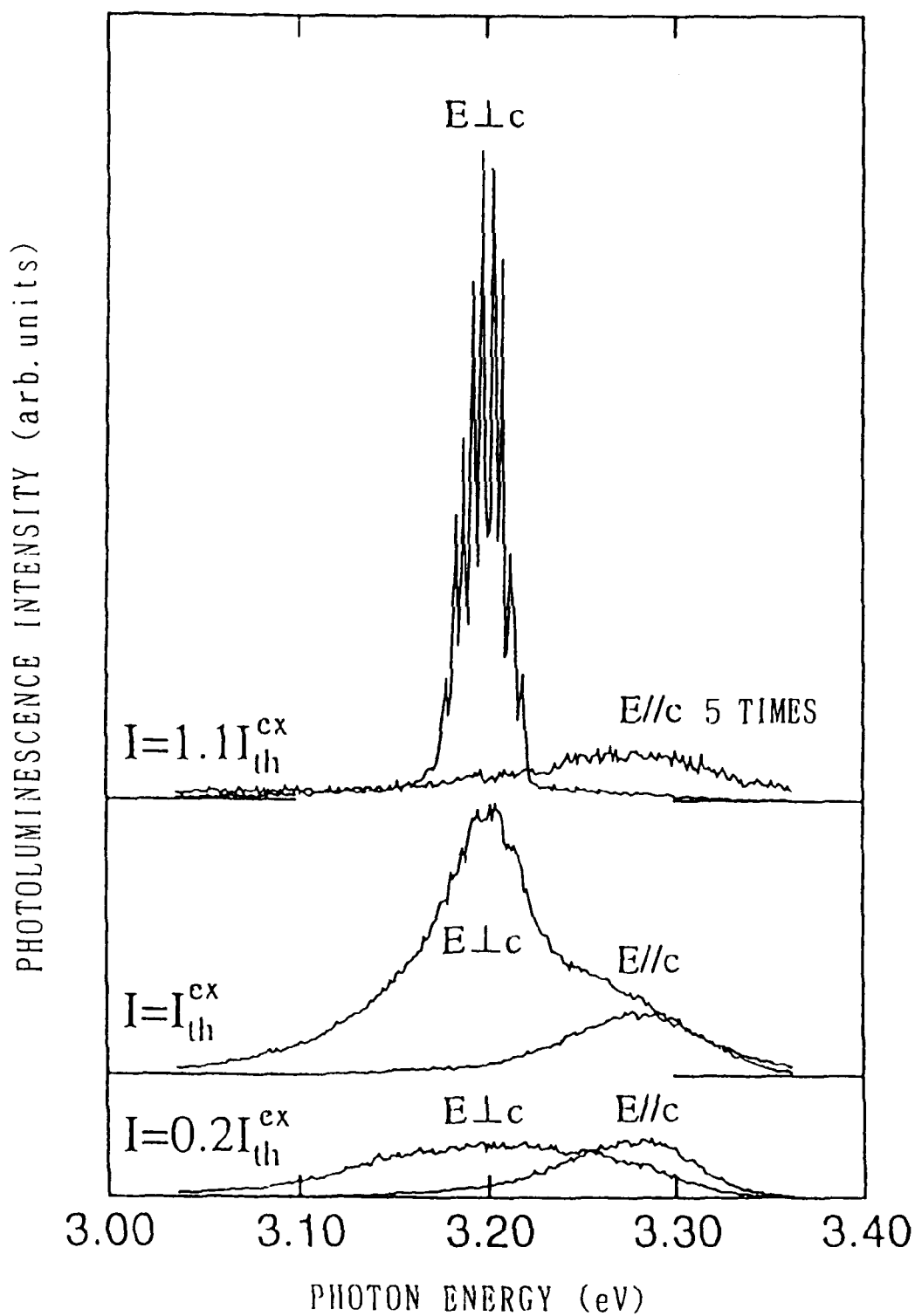
FIG. 11 is a graph showing the longitudinal mode polarized spectrum of P∞ photoluminescence in the embodiment of the present invention.
Figure 12:
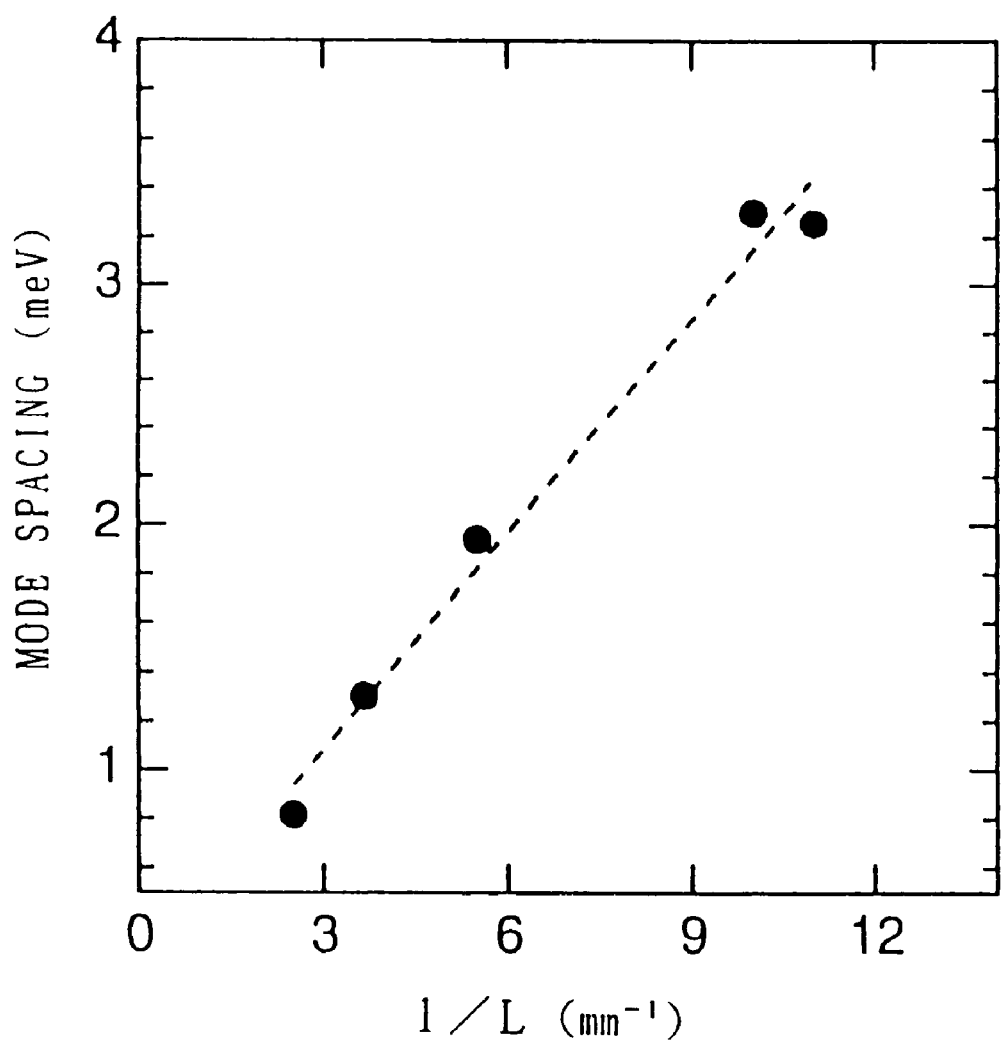
FIG. 12 is a plot showing the relationship between the mode spacing and the excited length.

FIG. 11 shows P∞ emission spectra measured through TE (⊥c) polarization and TM (//c) polarization, respectively. That is, FIG. 11 shows P∞ emission spectra as viewed from the lateral side for the case of $I_{th}$=24 kW/cm$^2$. The emitted light has a spectrum characterized by strong concentration to the TE polarization and finely split peaks. As shown in FIG. 12, the mode spacing (ΔE) changes depending on the length of an excited region (excited length: L). This indicates that the P∞ emission is caused by laser oscillation in a longitudinal mode cavity with both ends of the excited area serving as mirrors.

FIG. 13 shows the angular dependency of the laser oscillation intensity. Nanocrystals were formed on a circular substrate, and the laser intensity was measured while the sample was turned. A strong emission was observed when the excited area was able to use the grain boundaries of the hexagonal crystals as resonator mirrors, whereas the intensity decreased when the angular position of the substrate was shifted from that position by 30°. This indicates that the grain boundaries serve as resonator mirrors.

Next, a description will be given of the mechanism in which both ends of the excited area serve as resonator mirrors.

In the exited area, due to a large carrier density, the refractive index becomes larger than in unexcited areas. At the edge of the excited area, the excitation intensity changes continuously and is considered to have a distribution similar to that of the refractive index of the thin film. When a certain refractive threshold is assumed, reflection of light occurs at only grain boundaries between a row of nanocrystals and a different row of nanocrystals existing in the area where the refractive index varies continuously, so that a Fabry-Perot resonator is formed between the opposite end surfaces.

From the cross section TEM observation, it is considered that since the grain boundaries are formed parallel to the c-axis from the substrate/thin-film interface to the surface of the thin film, the grain boundaries of the nanocrystals function as mirror surfaces having a high degree of parallelism and high reflectivity. The self-formed cavity mirrors do not require any mirror formation process such as cleavage or etching. In addition, through attachment of a properly-shaped electrode to a diode, an active area can be freely determined, and a resonator can be provided.

Figure 14:
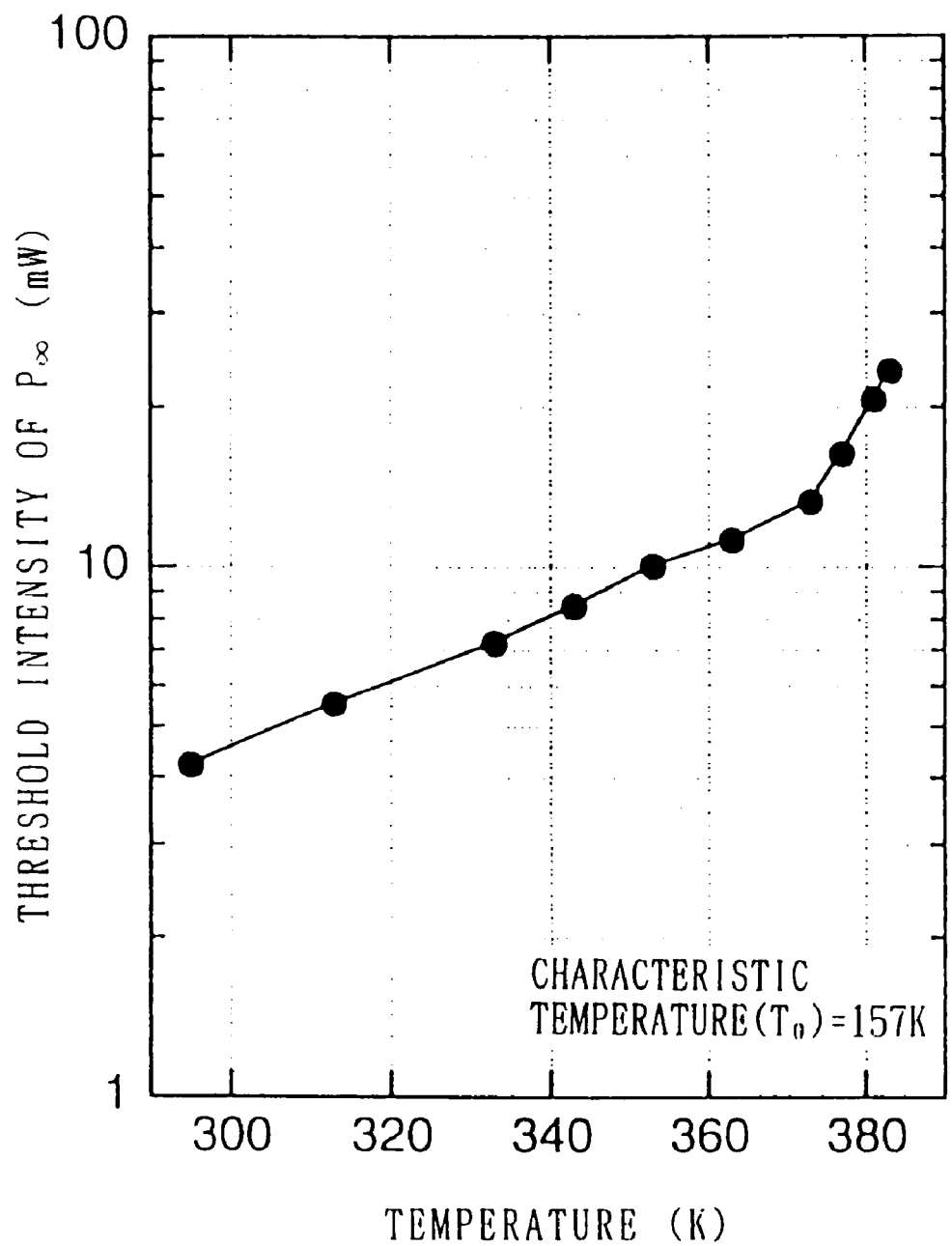
FIG. 14 is a plot showing the relationship between the crystal temperature and the laser oscillation threshold.

FIG. 14 shows the temperature dependency of the above-described exciton laser oscillation threshold. For the 50 nm-thick thin film, variation in the threshold excitation intensity of P∞ emission with the crystal temperature is plotted. The value of the vertical axis is shown by a Log scale. As is apparent from FIG. 14, although the threshold gradually increases when the crystal temperature exceeds room temperature (300 K), laser oscillation caused by excitons is observed up to about 380 K (100° C.). From the slope of this graph, the characteristic temperature is calculated as 157 K, which is higher than the characteristic temperature (124 K) of ZnSe. Therefore, ZnO is an excellent laser material.

FIG. 15 shows a historical change in the laser oscillation threshold in GaN and ZnO.

The threshold value in GaN based laser diodes has been lowered year by year through quality improvement of thin film and through employment of a quantum well and a cladding layer.

The laser oscillation threshold of the naturally formed ZnO nanocrystals thin film according to the present invention is lower than the best value of GaN-based laser diodes. Therefore, ZnO thin film is very promising as a material for short wavelength laser.

GaAs double-hetero laser diodes are presently applied to pick-up laser devices of compact disk players and are the most popular laser diodes. Therefore, the laser oscillation threshold of the GaAs double-hetero laser diodes is used as a standard, based on which practicability is determined. The oscillation threshold of a diode positively utilizing exciton light emission is expected to exceed the standard level. Through application of a double heterostructure and a light confinement structure to the ZnO diode, the efficiency of the exciton light emission can be increased further.

For example, in addition to ZnO, magnesium or cadmium may be added.

Further, through utilization of UV light emission of the ZnO thin film, a color display as described below can be fabricated.

Conventionally, a color display is fabricated through combination of light emitting diodes of three basic colors; i.e., blue, green, and red. Therefore, a huge number of diodes must be used to assemble a color display.

Since ZnO emits UV light, such a color display can be manufactured easily through use of ZnO film. That is, a large number of ZnO UV light emitting diodes are formed on a large-area display substrate in an integrated manner, and blue, green, and red fluorescent layers are added to the respective diodes such that the fluorescent layers are excited by UV light from the ZnO diodes to emit blue, green, and red light. Since crystals of ZnO can be grown at a temperature not higher than 600° C., inexpensive substrates having large areas such as glass substrates can be used.

The present invention is applicable to a wide range of fields such as optical semiconductor elements (LEDs, laser diodes, etc.) which emit light in the blue to UV range; pick-up laser devices for optical storage disks (CD, MO, DVD); flat panel displays utilizing light emitting diodes; display sections of traffic signals or the like utilizing light emitting diodes; and optical semiconductor elements used for illumination such as a germicidal lamp.

As described above, the present invention has the following advantages.

(1) Since artificial manufacture of resonators for laser oscillation is unnecessary, optical semiconductor elements having a simplified structure can be obtained.

(2) An active area can be formed freely through attachment of an electrode to a diode.

(3) A laser can be generated by exciton-exciton scattering at room temperature.

(4) The laser oscillation threshold of a semiconductor laser element can be lowered greatly.

Next, another embodiment of the present invention will be described.

The formation of thin film for II-oxide optical semiconductor elements was carried out in accordance with a laser molecular beam epitaxy method. A KrF eximer laser (wavelength: 248 nm, pulse frequency: 10 Hz) was used, and the power of laser was set to 0.9 J/cm². Through use of a ZnO sintered body containing 0 to 18 mol % of magnesium, a film was formed on the sapphire substrate (0001) at a filming temperature of 600° C. and an oxygen partial pressure of 5×10⁻⁵ Torr. The magnesium content of the thus formed thin film was measured through plasma emission analysis. Further, through use of an X-ray diffraction method, the lattice constant was determined, and based on presence/absence of a heterophase, judgment is made as to whether or not a solid-solution state was created. Further, visible/UV light transmission spectrum measurement was conducted to determine the optical band gap.

Also, photoluminescence excited by a He—Cd laser at 4.2 K was measured.

From the results of measurement of the composition of the thin film through plasma emission analysis, it was found that the magnesium content of the thin film was higher than that of the source target. FIG. 16 shows the relationship between the magnesium content of targets and the magnesium content of thin films. The reason why the thin film has a higher magnesium content is considered as follows.

Since the vapor pressures of zinc oxide and zinc are considerably higher than those of magnesium oxide and magnesium, among these materials deposited on the surface of the thin film, the zinc specie is considered to re-evaporate in a larger amount. Thus, the density of the zinc specie at the surface increases and is taken into crystals, so that magnesium is condensed in the thin film.

A sample obtained by crushing a target was subjected to X-ray diffraction analysis so as to evaluate crystals in the target. The evaluation result indicates that when the magnesium content was 10 mol % or less, phase other than zinc oxide was not observed, but when the magnesium content was 13 mol % or greater, a peak of magnesium oxide (halite type) was observed. As for the thin film, no heterophase peak was observed until the magnesium content reached 25 mol %, and a heterophase peak was first observed when the magnesium content reached 33 mol %.

The quantitative limit of magnesium oxide which can be incorporated into zinc oxide in a solid-solution form has been reported to be 4 mol %. Next, a description will be given of the reason why magnesium was incorporated in zinc oxide in an amount exceeding the thermodynamic solid-solution limit.

The laser molecular beam epitaxy method is a method in which solid substance is excited into a high-energy plasma state in vacuum and is then condensed and deposited on a substrate. The components of the excited solid substance are condensed instantaneously, so that crystals are formed before the substance settles into a thermodynamically equilibrated state at the substrate temperature. Therefore, it is possible to fabricate a thin film having a composition and structure that are not permitted thermodynamically. That is, metastable thin film crystals can be fabricated.

In the present invention, the solid-solution limit of magnesium is elevated through use of laser molecular beam epitaxy as a film forming method.

Figure 17:
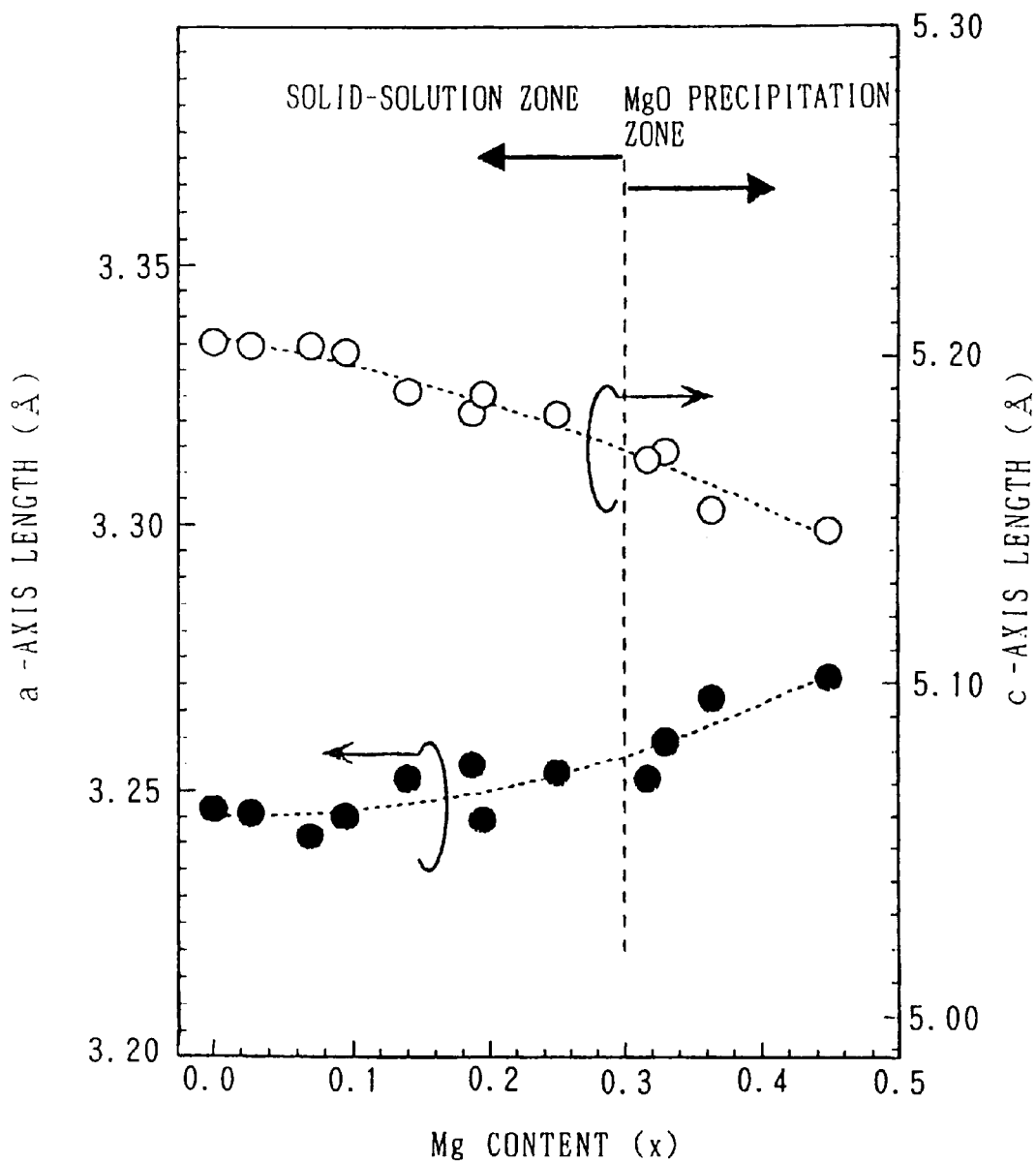
FIG. 17 is a plot showing variations in the a-axis and c-axis lengths of the zinc oxide thin film with the magnesium content.

FIG. 17 shows variations in the a-axis and c-axis lengths with magnesium content that are obtained from the peak positions of zinc oxide (004) and zinc oxide (101). As the magnesium content increased, the c-axis length decreased, whereas the a-axis length increased. When the magnesium content was 25 mol % or less, the crystallinity of the thin film was comparable to that of pure zinc oxide thin film. However, when the magnesium content was 33 or 45 mol %, precipitation of a heterophase and deterioration of crystallinity were observed. This indicates that when the magnesium content is 33 mol % or higher, the thin film crystals are in a zone of mixed phase crystal comprising magnesium oxide solid-solution and zinc oxide solid-solution.

FIG. 18 shows a UV/visible light transmission spectrum of $Zn_{1-x}Mg_xO$ at room temperature for different values of magnesium contents. As is apparent from FIG. 18, the absorption edge shifts toward the shorter wavelength side with increasing magnesium content, and saturation occurs when the magnesium content reaches to 33 mol %.

FIG. 19 shows variation in the optical band gap of zinc oxide thin film at room temperature with magnesium content.

As is apparent from FIG. 19, the band gap obtained from the absorption coefficient was increased to 4.17 eV, which is higher than the band gap (3.26 eV) of a pure zinc oxide thin film.

In the area where no heterophase existed, or when the magnesium content was 0 to 25 mol %, the maximum band gap increased to 3.86 eV.

Figure 20:
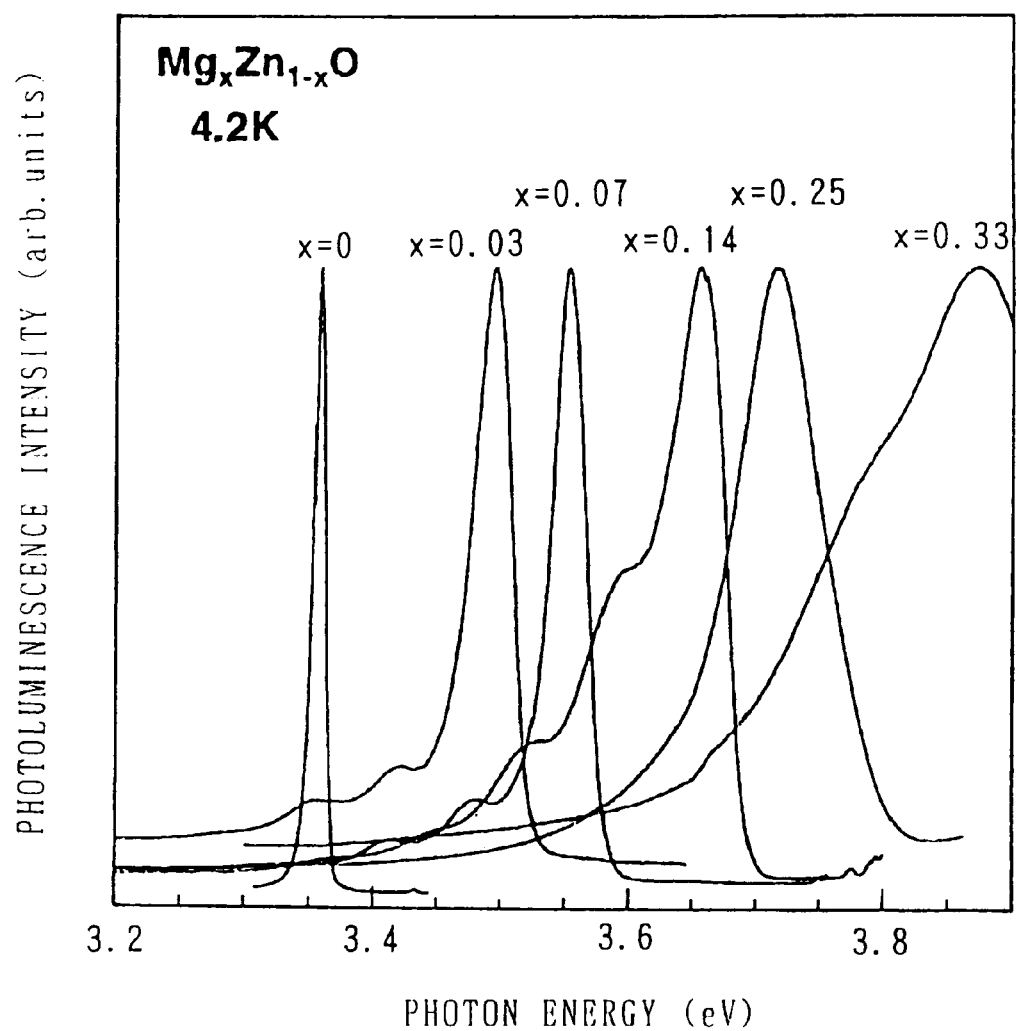
FIG. 20 is a diagram showing the photoluminescence spectrum of the $Mg_xZn_{1-x}O$ ($0 \leq x \leq 0.33$) at 4.2 K.

FIG. 20 shows a photoluminescence spectrum at 4.2 K for magnesium content in the range of 0 to 33 mol %.

As is apparent from FIG. 20, the emission peak shifted toward the shorter wavelength side as the magnesium content increased. The fact that a new emission peak does not appear even when magensium is added and the fact that no light emission is observed at a deep level suggests that magnesium is uniformly and stably replaced at zinc sites.

As described above, while a ZnO sintered body containing 0 to 18 mol % of MgO was used as a target, a thin film of $Zn_{1-x}Mg_xO$ was formed on a sapphire substrate (0001) in accordance with a pulse laser deposition method. From this, it was found that at a film forming temperature of 600° C., MgO is incorporated in ZnO in a solid-solution state when the target composition is 25 mol % or less. It was also found that the amount of incorporated MgO is much higher than the thermodynamic solid-solution limit (4 mol %) at 1200° C.

FIG. 21 shows a phase diagram of a MgO-ZnO system.

The main cause of this phenomenon is lack of equilibrium in the fabrication process. A decrease in the c-axis length and an increase in the a-axis length were observed when MgO is incorporated in a solid-solution state. Further, the maximum band gap at room temperature increased to 4. 17 eV.

The formation of a zinc oxide thin film containing cadmium was carried out in accordance with a laser molecular beam epitaxy method. A KrF eximer laser (wavelength: 248 nm, pulse frequency: 10 Hz) was used, and the power of laser was set to 1 $J/cm^2$. Through use of a ZnO sintered body containing 0 to 20 molt of cadmium, a film was formed on the substrate of sapphire (0001) at a deposition temperature of 400° C. and an oxygen partial pressure of $5 \times 10^{-5}$ Torr. The cadmium content of the thus-formed thin film was measured through plasma emission analysis and through use of an X-ray micro analyzer. Further, through use of an X-ray diffraction method, the lattice constant was determined. Further, visible/UV light transmission spectrum measurement was conducted to determine the optical band gap. Also, photoluminescence excited by He-Cd laser at 4.2 K was measured.

FIG. 22 shows the relation ship between the cadmium content of targets and the cadmium content of thin films. Unlike the case of the zinc oxide thin film including magnesium oxide in a solid-solution state, the cadmium content of the thin film was one fifth that of the cadmium content of the target. This is due to the relationship "vapor pressure of cadmium species>vapor pressure of zinc species," and therefore zinc is condensed in the thin film. As cadmium evaporates considerably easily, the maximum cadmium content of the thus-obtained thin film was 0.073.

The result of X-lay diffraction demonstrates that no heterophase precipitated from either thin film. Therefore, the solid-solution limit of cadmium in the zinc oxide is considered to be not lower than 0.073.

Figure 23:
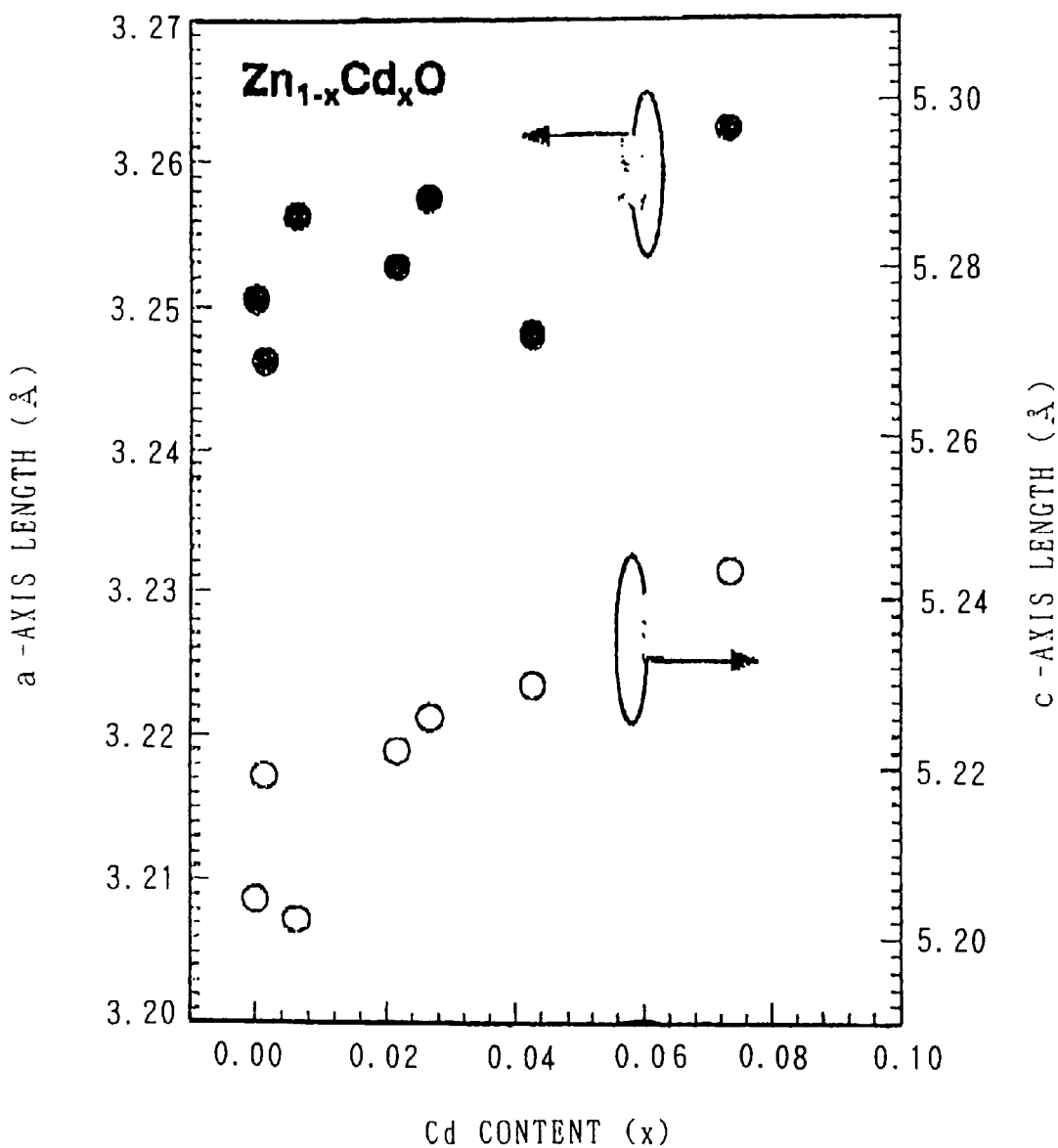
FIG. 23 is a plot showing variations in the a-axis and c-axis lengths of the zinc oxide thin film with the cadmium content.

FIG. 23 shows variation in the lattice constant with the cadmium content. As seen from this plot, both the a-axis length and the c-axis length increase as the cadmium content increases. This phenomenon is considered to occur because of cadmium's larger ion radius compared with that of zinc.

Figure 24:
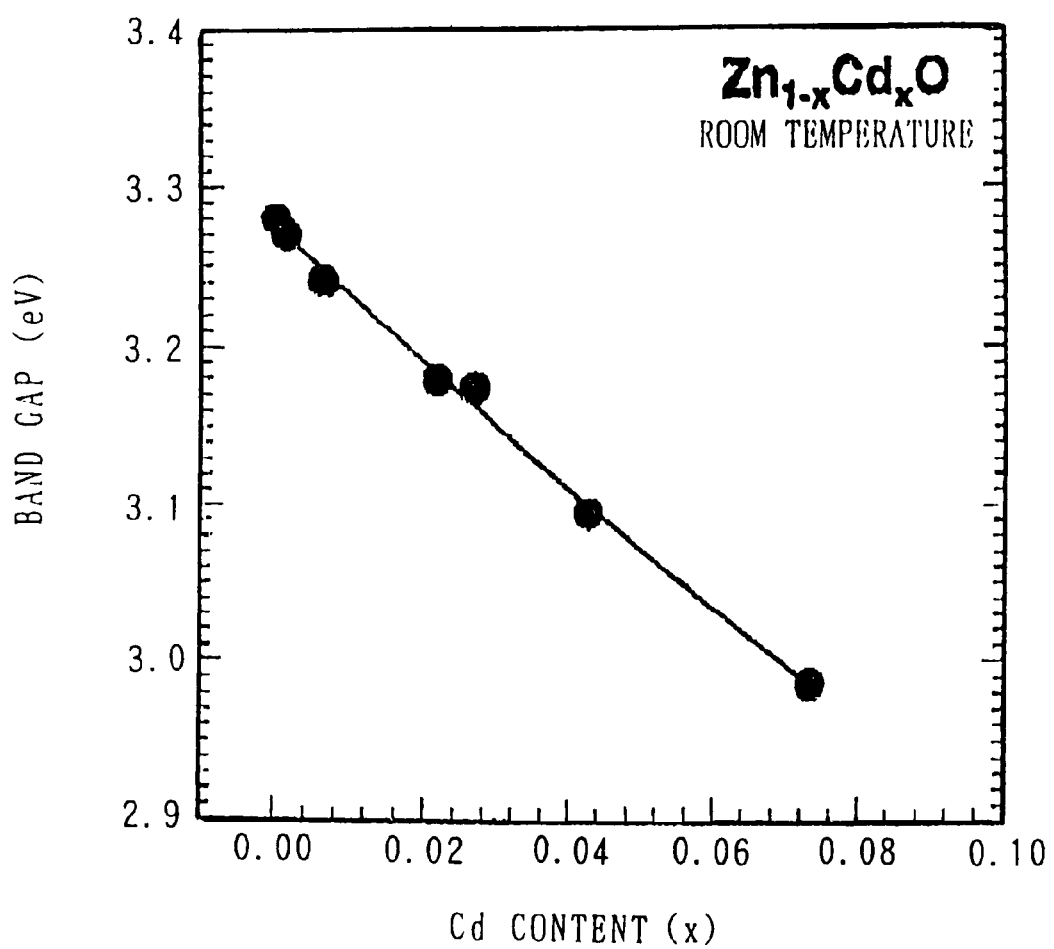
FIG. 24 is a plot showing variation in the optical band gap of the zinc oxide thin film at room temperature with the cadmium content.

FIG. 24 shows variation in the band gap obtained from a UV/visible light transmission spectrum of zinc oxide thin film at room temperature for different values of cadmium content. As is apparent from FIG. 24, the lowest band gap decreased to 3 eV. The band gap decreased linearly as the cadmium content increased. It is known that in other Zn-VI compounds, addition of cadmium decreases their band gaps. Since the ratio of reduction of the band gap attained by the combination of zinc oxide and cadmium oxide is greater than that attained by a combination of any other Zn-VI compound and cadmium, the low energy band gap can be obtained at a smaller cadmium content.

Figure 25:
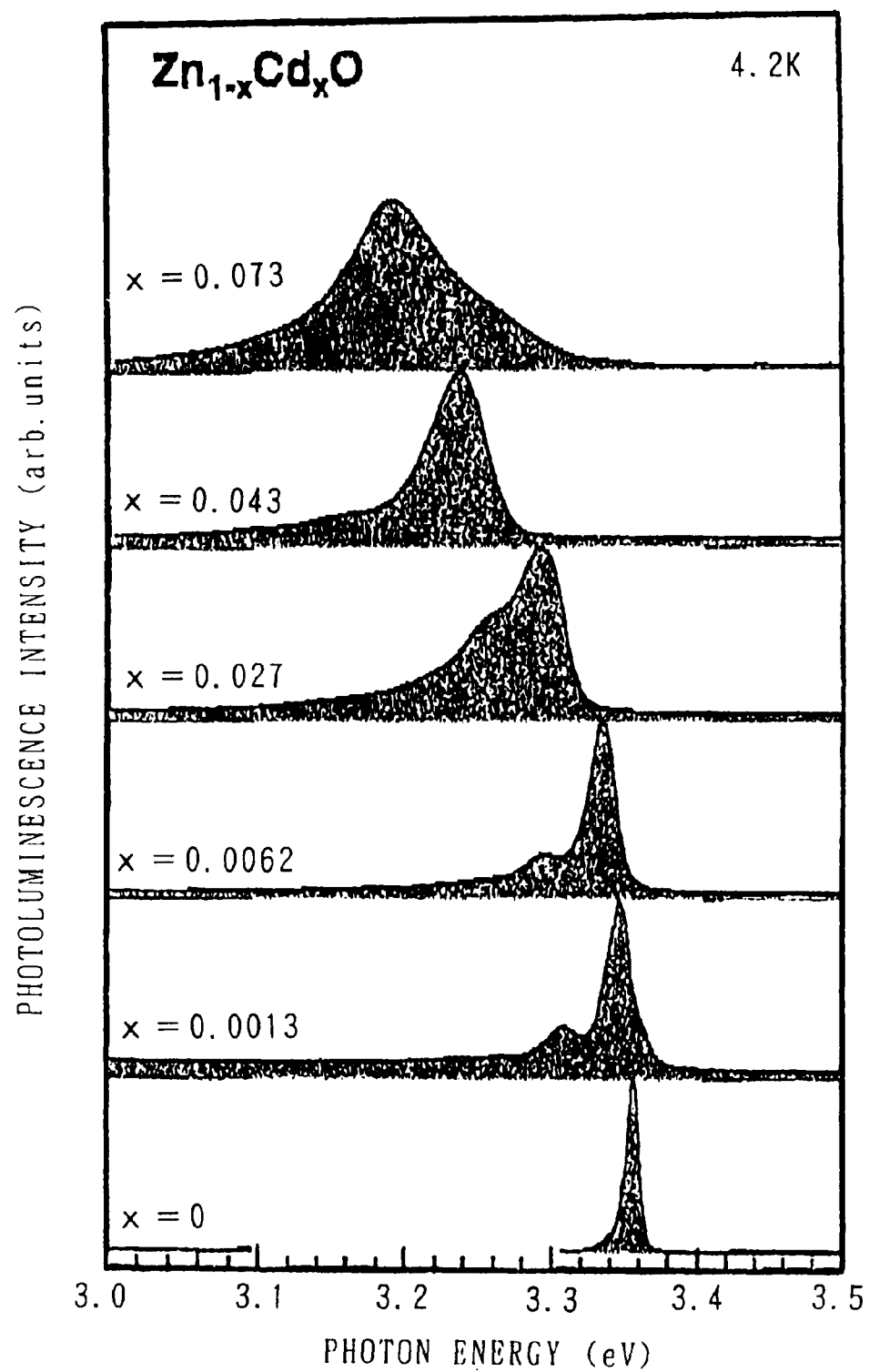
FIG. 25 is a diagram showing the photoluminescence spectrum of the $Zn_{1-x}Cd_xO$ zinc oxide thin film at 4.2 K for different cadmium contents.

FIG. 25 shows a photoluminescence spectrum at 4.2 K for different cadmium contents. As in the case of the band gap, the position of the emission peak shifted toward the lower energy side.

It is concluded that at room temperature, the band gap of zinc oxide can be controlled within the range of about 3 to 4 eV through addition of magnesium or cadmium into zinc oxide.

In order to confirm that the obtained thin film is actually effective in fabrication of a double heterostructure, there was fabricated a laminated structure in which a zinc oxide thin film was sandwiched between two zinc oxide films each containing 20 mol % of magnesium in a solid-solution state. The zinc oxide thin film serving as an intermediate layer had a thickness of 70 nm, and each of the upper and lower magnesium-containing thin film had a thickness of 140 nm.

FIG. 26 shows the X-ray diffraction peak of zinc oxide (0004). As is indicated by the dotted line in FIG. 26, the peak is composed of four lines; i.e., copper $K\alpha1$ and $K\alpha2$ lines of the zinc oxide layer, and copper $K\alpha1$ and $K\alpha2$ lines of the magnesium-containing layer. Further, the peak of the zinc oxide layer and the peak of the magnesium containing layer are clearly separated from each other. Clear exciton light emission from the zinc oxide layer was observed as well.

From the above-described results, it can be said that the obtained zinc oxide film containing magnesium in a solid-solution state can undergo epitaxial growth together with zinc oxide thin film in an alternating manner.

Further, in order to fabricate a zinc-oxide-based quantum structure, there was studied fabrication of a superlattice structure composed of MgZnO thin film and zinc oxide thin film. Superlattices of 10 periods were fabricated by changing the thickness of the zinc oxide film from 1.2 to 12 nm, while the thickness of the MgZnO thin film was maintained at 6.2 nm.

Figure 27:
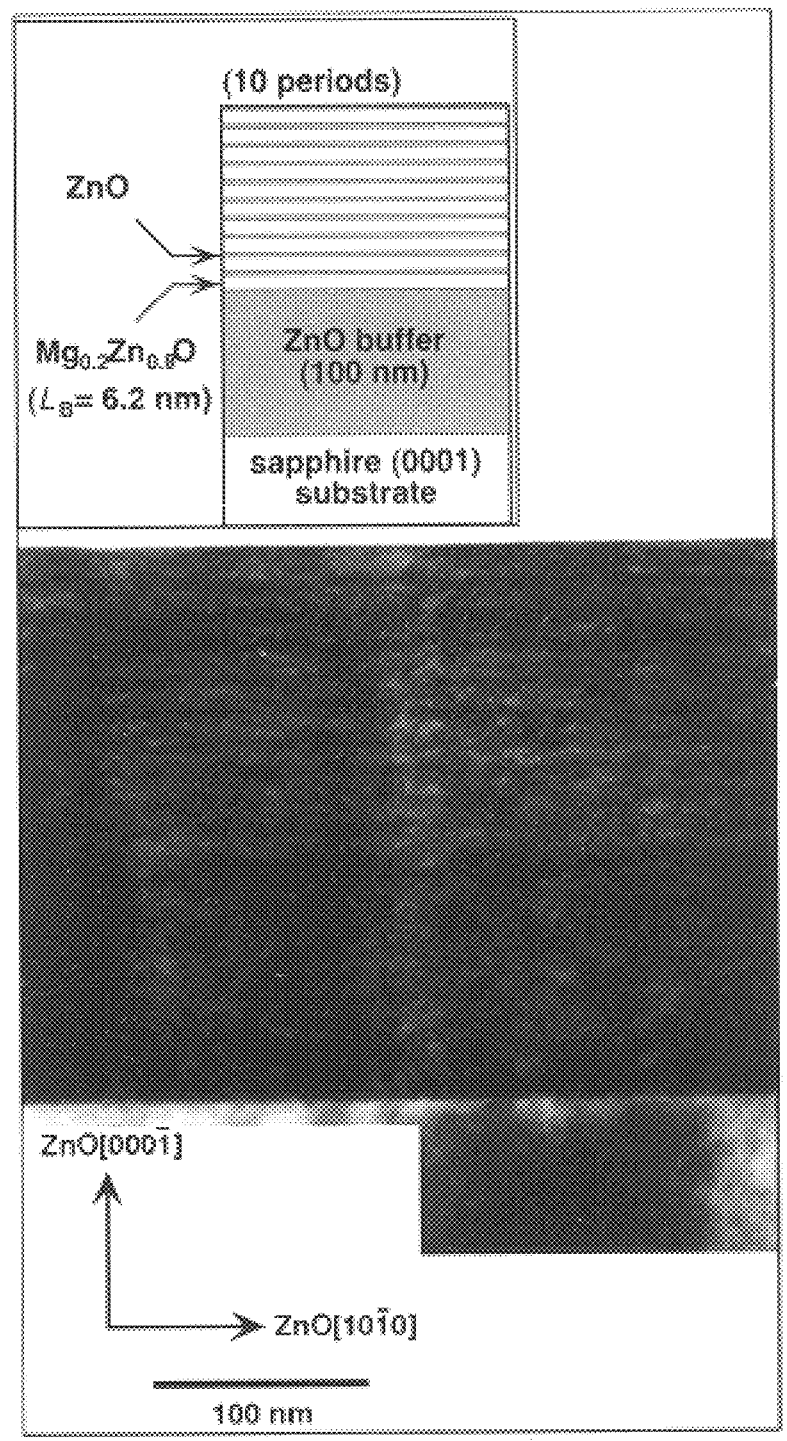
FIG. 27 is a cross-sectional TEM (transmission electron microscope) image of the ZnO/MgZnO superlattice film according to still another embodiment of the present invention.

FIG. 27 shows a cross-sectional TEM image of the superlattice structure composed of a magnesium containing zinc oxide thin film (magnesium content: 0.2) and a zinc oxide thin film. The schematic diagram of the superlattice structure is inserted into FIG. 27. As can be seen from FIG. 27, the hetero-interface and the surface are very flat. The superlattice is fabricated on a zinc oxide thin film formed on a sapphire substrate in order to improve the flatness of the surface. That is, the zinc oxide thin film is used as a buffer layer. The roughness of the surface of the magnesium containing thin film decreased to about one-tenth that of the surface in the case where a magnesium-containing thin film was deposited directly on a sapphire substrate.

Figure 28:
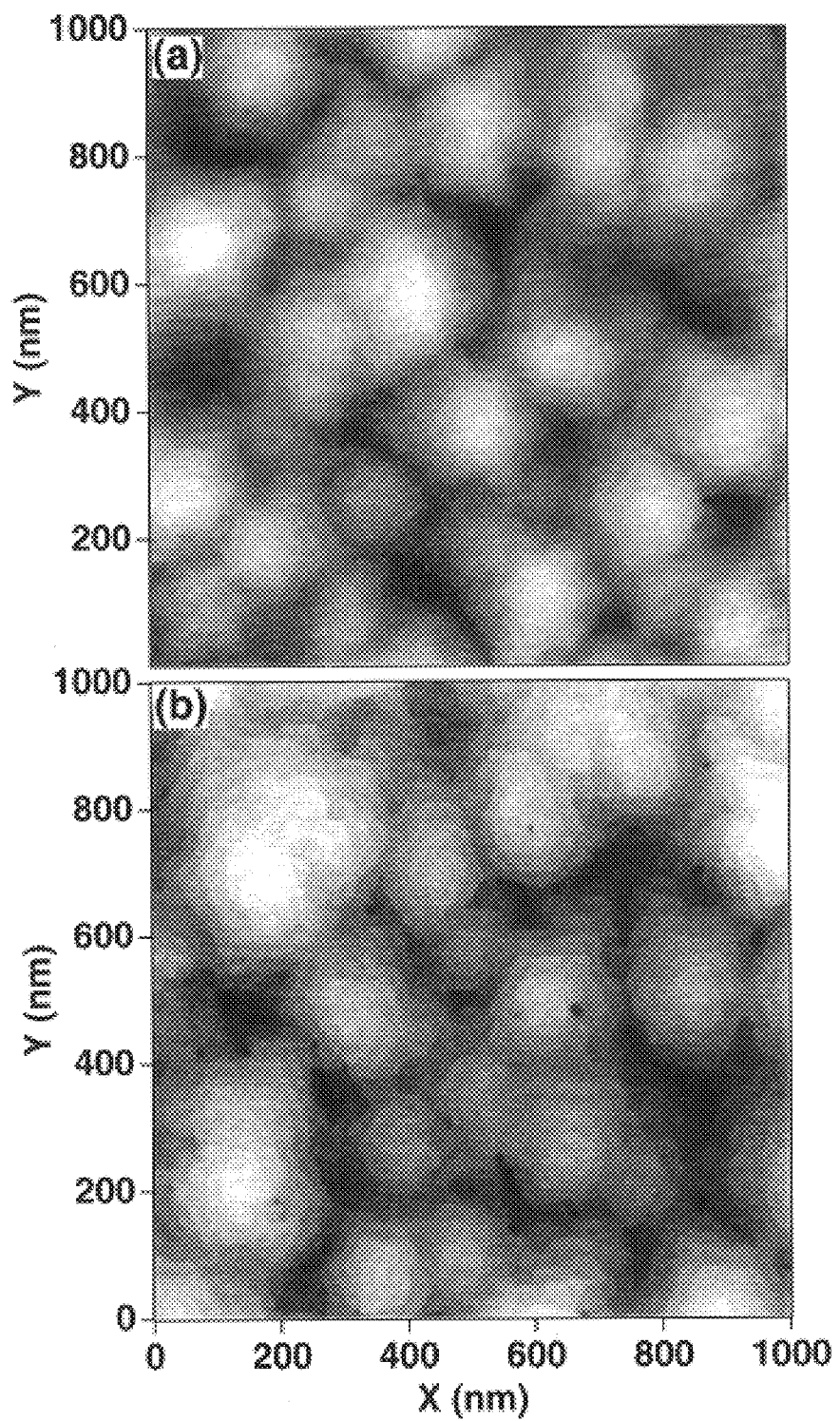
FIG. 28 shows AFM (atomic force microscopy) images of a ZnO buffer layer and a ZnO/MgZnO superlattice thin film.

FIG. 28 shows AFM images of a ZnO buffer layer and a sample of the superlattice. The hexagonal spiral formed on the surface of the buffer layer can be observed from the top of the superlattice as well. From this, it is presumed that each layer of the superlattice was deposited through spiral growth.

FIG. 29 shows X-ray diffraction patterns of the superlattice. In the diffraction pattern of each sample, a diffraction peak corresponding to the superlattice period was observed at a shoulder of each of a low angle incident peak and a zinc oxide (0002) peak. These diffraction patterns match well with the result of simulation (see dotted line in FIG. 29). Therefore, it can be concluded that the degree of interface diffusion of magnesium or the roughness of the interface is very low, and therefore a good interface is formed.

Figure 30:
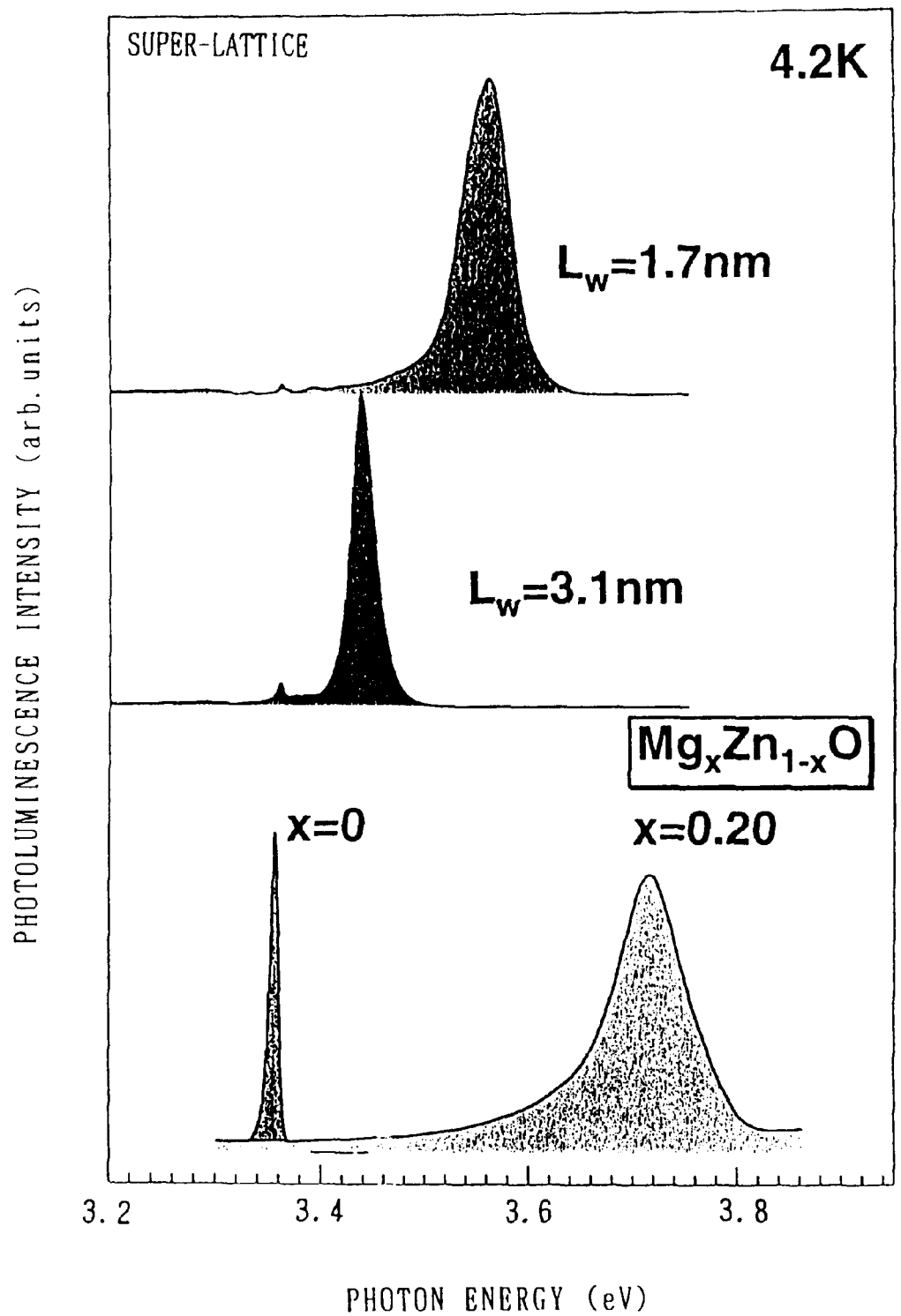
FIG. 30 is a diagram showing the photoluminescence spectrum of the ZnO/MgZnO superlattices.

FIG. 30 shows the photoluminescence spectrum of the superlattice. As can be seen from FIG. 30, the emission peak of the superlattice shifted from the emission peak of the zinc oxide thin film toward the higher energy side in an amount that decreases as the thickness of the zinc oxide thin film decreased. This phenomenon is considered to occur due to a quantum effect caused by confinement of carriers.

From the above, the zinc oxide thin film containing magnesium in a solid-solution state is considered to be useful for fabrication of a quantum structure.

Next, a description will be given of an element according to another embodiment of the present invention.

Figure 31:
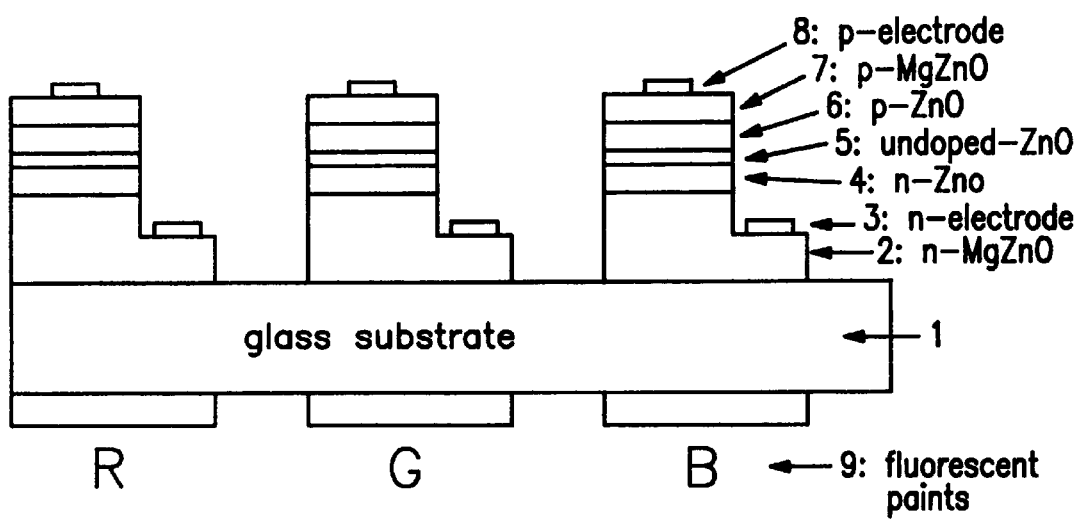
FIG. 31 is a schematic diagram of a monolithic full-color LED element utilizing the zinc oxide thin film, showing still another embodiment of the present invention.

FIG. 31 shows a schematic diagram of a monolithic full-color LED element utilizing the zinc oxide thin film according to the embodiment of the present invention.

In FIG. 31, numeral 1 denotes a glass substrate, on which are disposed for each color an n-type MgZnO layer 2, an n-type electrode 3, an n-type ZnO layer 4, an undoped ZnO layer 5, a p-type ZnO layer 6, a p-type MgZnO layer 7, and a p-type electrode 8 in this sequence. Also, for each color a fluorescence coating is formed on the bottom surface of the glass substrate 1.

In ordinary full-color LED displays, emission of each color must be achieved through use of a different material. By contrast, in the present invention, the full-color LED element is composed of only a "UV light source" and a "RGB fluorescent material," and can be fabricated in an integrated manner on a glass substrate that allows passage of UV light.

Figure 32:
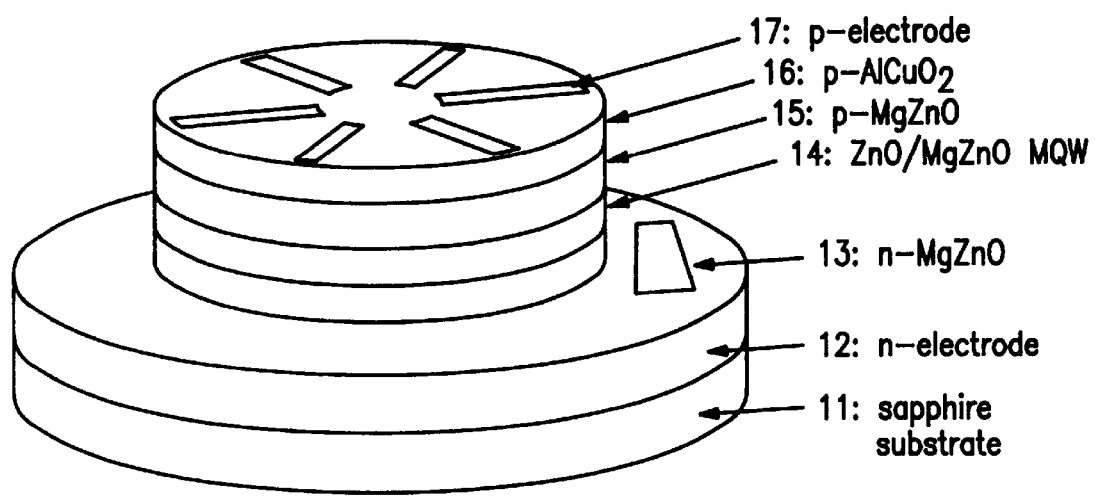
FIG. 32 is a schematic diagram of a laser emission element utilizing the zinc oxide thin film, showing still another embodiment of the present invention.

FIG. 32 is a schematic diagram of a laser emission element utilizing the zinc oxide thin film according to still another embodiment of the present invention.

In FIG. 32, numeral 11 denotes a sapphire substrate, on which are disposed an n-type electrode 12, an n-type MgZnO layer 13, a ZnO/MgZnO multi-quantum well layer 14, a p-type MgZnO layer 15, a p-type AlCuO$_2$ layer 16, and a p-type electrode 17, in this sequence.

According to the present invention, there can be fabricated a laser structure in which the grain boundaries of hexagonal nanocrystals serve as mirrors. Therefore, a laser device that can emit laser in an arbitrary direction (every 60°) can be fabricated through a simple process in which, after formation of a p-n junction, a narrow metal electrode extending in a direction perpendicular to the grain boundaries is deposited thereon.

Since the n-type zinc oxide film has an extremely low resistance, the n-type zinc oxide film is formed at the lowermost portion in order to allow current to be injected from a side. Although the p-type zinc oxide film has a high resistance, the contact resistance between the p-type zinc oxide layer and the electrode can be made very low, because, in the present embodiment, AlCuO$_2$ (Delaphoscite) serving as an intermediate layer is interposed between the p-type zinc oxide layer and the electrode. Therefore, a voltage to be applied to the element can be made lower, so that stable drive is enabled while power consumption is decreased.

As described above, the present invention has the following advantageous effects.

(A) Fabrication of a thin film having high crystallinity is enabled through use of a laser molecular beam epitaxy (MBE) method, and therefore, light emission caused by recombination of excitons is realized even at room temperature.

In the thin film having a zinc oxide nanocrystalline structure, since laser oscillation occurs due to exciton-exciton scattering, the oscillation threshold is very low.

Since laser resonators are formed by naturally grown surfaces, a process for fabricating resonators through cleavage or etching becomes unnecessary.

Further, though addition of magnesium, the band gap of zinc oxide can be increased. Therefore, the wavelength of emitted light can be shortened through use of a zinc oxide film to which magnesium is added.

(B) Even at room temperature, crystals can be grown on a glass substrate.

(C) The binding energy of excitons of zinc oxide is 60 meV, which is very high compared with those of GaN (24 mev) and ZnSe (22 meV), excitons exist stably even at room temperature. Further, laser oscillation caused by exciton emission is enabled even at room temperature.

When a zinc oxide thin film is used as a light emission layer, any of the following structures can be employed in order to enhance the emission efficiency:

(a) A structure in which a very thin light emission layer is sandwiched between two layers made of a material having a band width greater than that of the light emission layer in order to confine carriers and facilitate the radiative recombination;

(b) A structure in which a light emission layer is sandwiched between light confinement layers in order to efficiently take out emitted light to the outside of the element; or (c) A structure in which magnesium is included into zinc oxide thin film in a solid-solution state to achieve the effects obtained through employment of the above-described structures.

For such a purpose, there is required a material whose lattice constant in the plane matches that of zinc oxide and which has a band width larger than that of zinc oxide. Fabrication of mixed crystal of zinc oxide is effective for this purpose.

(D) The thin film containing magnesium in a solid-solution state can undergo expitaxy growth together with zinc oxide in an alternating manner, and therefore use of this thin film enables fabrication of carrier confinement layers formed of zinc oxide.

Further, in the II-oxide optical semiconductor element of the present invention, there is utilized a zinc oxide thin film containing magnesium or cadmium in a solid-solution state. Through addition of magnesium or cadmium, the band gap of zinc oxide can be controlled within the range of 3 to 4 eV.

The present invention is not limited to the above-described embodiments. Numerous modifications and variations of the present invention are possible in light of the spirit of the present invention, and they are not excluded from the scope of the present invention.

What is claimed is:

1. An optical semiconductor element comprising a thin film containing ZnO, said thin film having grain boundaries which are barriers providing exciton confinement and laser resonator mirrors, and said thin film emitting light in the UV range.

2. An optical semiconductor element according to claim 1, wherein the thin film is a thin film of hexagonal ZnO nanocrystals.

3. An optical semiconductor element according to claim 2, wherein the thin film of hexagonal ZnO nanocrystals is formed by use of a laser molecular beam epitaxy (MBE) method.

4. An optical semiconductor element according to claim 1, further comprising a fluorescence layer that is excited by ultraviolet or blue light emitted from said thin film to generate visible light usable for color display or illumination.

5. A II-oxide optical semiconductor element which comprises a zinc oxide thin film containing magnesium in a solid solution or mixed phase state, said magnesium raising the band gap of said zinc oxide and said thin film having grain boundaries which are barriers providing exciton confinement and laser resonator mirrors, and said thin film emitting light in the UV range.

6. A II-oxide optical semiconductor element which comprises a zinc oxide film containing cadmium in a solid solution or mixed phase state. said cadmium lowering the band gap of said zinc oxide and having grain boundaries which are barriers providing exciton confinement and laser resonator mirrors, and said thin film emitting light in the UV range.

7. A II-oxide optical semiconductor element according to claim 5, further comprising a fluorescence layer that is excited by ultraviolet or blue light emitted from the light emitting layer to generate visible light, thereby enabling color display or illumination.

8. A II-oxide optical semiconductor element according to claim 5, which has a double heterostructure in which the zinc oxide thin film serving as a light emitting layer is sandwiched between zinc oxide thin films each containing magnesium in a solid solution state and serving as a carrier confinement and cladding layer.

9. An optical semiconductor element comprising a ZnO light emitting layer, a p-type zinc oxide layer, an electrode and a thin film of $AlCuO_2$ as an intermediate layer disposed between the p-type zinc oxide layer and the electrode.

10. An optical semiconductor element according to claim 1 further comprising a substrate, said thin film being formed on said substrate by laser molecular beam epitaxy.

11. An optical semiconductor element according to claim 10 wherein said substrate is a sapphire crystal and said thin film is formed on a C-surface of said sapphire crystal.

12. An optical semiconductor element according to claim 1 additionally comprising a crystalline substrate having a surface supporting said thin film and wherein said grain boundaries are perpendicular to the surface of the substrate and are formed, by lattice mismatch between said Zno and said substrate, at a recurrent distance corresponding to a common multiple of lattice spacing of said substrate and lattice spacing of said Zno.

13. An optical semiconductor element according to claim 12 wherein said thin film is composed of hexagonal ZnO nanocrystals.

14. An optical semiconductor element according to claim 13 wherein said Zno nanocrystals have a lateral dimension in the range of 40–60 nm.

15. An optical semiconductor according to claim 13 which emits said light in the UV range at room temperature.

16. A II-oxide optical semiconductor element according to claim 5, further comprising a fluorescence layer that is excited by ultraviolet or blue light emitted from the light emitting layer to generate visible light, thereby enabling color display or illumination.

17. An optical semiconductor element according to claim 5 additionally comprising a crystalline substrate having a surface supporting said thin film, wherein said grain boundaries are perpendicular to the surface of the substrate and are formed, by lattice mismatch between said ZnO and said substrate, at a recurrent distance corresponding to a common multiple of lattice spacing of said substrate and lattice spacing of said ZnO and wherein said thin film is composed of hexagonal ZnO nanocrystals containing said magnesium.

18. An optical semiconductor element according to claim 17 wherein said ZnO nanocrystals have a lateral dimension in the range of 40–60 nm.

19. An optical semiconductor element according to claim 6 additionally comprising a crystalline substrate having a surface supporting said thin film, wherein said grain boundaries are perpendicular to the surface of the substrate and are formed, by lattice mismatch between said ZnO and said substrate, at a recurrent distance corresponding to a common multiple of lattice spacing of said substrate and lattice spacing of said ZnO and wherein said thin film is composed of hexagonal ZnO nanocrystals containing said cadmium.

20. An optical semiconductor element according to claim 19 wherein said ZnO nanocrystals have a lateral dimension in the range of 40–60 nm.

21. An optical semiconductor element according to claim 9 additionally comprising a crystalline substrate having a surface supporting said thin film and wherein said ZnO light emitting layer has grain boundaries perpendicular to the surface of the substrate which are formed, by lattice mismatch between said ZnO and said substrate, at a recurrent distance corresponding to a common multiple of lattice spacing of said substrate and lattice spacing of said ZnO and wherein said thin film is composed of hexagonal ZnO nanocrystals.

22. An optical semiconductor element according to claim 21 wherein said ZnO nanocrystals have a lateral dimension in the range of 40–60 nm.

* * * * *